(12) United States Patent
Yang et al.

(10) Patent No.: US 8,698,150 B2
(45) Date of Patent: Apr. 15, 2014

(54) ACTIVE DEVICE, DRIVING CIRCUIT STRUCTURE, AND DISPLAY PANEL

(71) Applicant: Au Optronics Corporation, Hsinchu (TW)

(72) Inventors: Chao-Yu Yang, Chiayi County (TW); Hao-Lin Chiu, Taipei (TW); Shu-Wei Tsao, Taipei (TW); Shih-Che Huang, New Taipei (TW); Po-Liang Yeh, New Taipei (TW); Chun-Nan Lin, Changhua County (TW); Shine-Kai Tseng, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/645,461

(22) Filed: Oct. 4, 2012

(65) Prior Publication Data

US 2013/0328069 A1    Dec. 12, 2013

(30) Foreign Application Priority Data

Jun. 8, 2012 (TW) ............................. 101120694 A
Aug. 22, 2012 (TW) ............................. 101130468 A

(51) Int. Cl.
  *H01L 29/04* (2006.01)
(52) U.S. Cl.
  USPC ......... 257/59; 257/72; 257/501; 257/E21.371

(58) Field of Classification Search
  USPC ............... 257/43, 59, 72, 192, 194, 499, 404, 257/409, 544, E21.371
  See application file for complete search history.

(56) References Cited

U.S. PATENT DOCUMENTS

| 7,579,634 | B2 | 8/2009 | Onodera et al. | |
|---|---|---|---|---|
| 2004/0016925 | A1* | 1/2004 | Watamura | 257/59 |
| 2010/0193784 | A1 | 8/2010 | Morosawa et al. | |
| 2011/0001736 | A1 | 1/2011 | Tanaka et al. | |
| 2012/0305925 | A1* | 12/2012 | Misaki | 257/59 |

FOREIGN PATENT DOCUMENTS

| CN | 101969060 | 2/2011 |
|---|---|---|
| TW | 595005 | 6/2004 |

* cited by examiner

*Primary Examiner* — Dung A. Le
(74) *Attorney, Agent, or Firm* — Jianq Chyun IP Office

(57) ABSTRACT

An active device, a driving circuit structure, and a display panel are provided. The active device includes a gate, a gate insulation layer covering the gate, a semiconductor layer disposed above the gate, an etching stop layer disposed on the gate insulation layer and the semiconductor layer, a source, and a drain. The gate forms a meandering pattern on a substrate. The semiconductor layer has an area substantially defining a device region where the active device is. The etching stop layer has a first contact opening and a second contact opening. The first contact opening and the second contact opening separated from each other and both exposing the semiconductor layer. The source and the drain separated from each other are disposed on the etching stop layer and in contact with the semiconductor layer through the first contact opening and the second contact opening, respectively.

47 Claims, 28 Drawing Sheets

ACTIVE DEVICE, DRIVING CIRCUIT STRUCTURE, AND DISPLAY PANEL

CROSS-REFERENCE TO RELATED APPLICATION

This application claims the priority benefit of Taiwan application serial no. 101120694, filed on Jun. 8, 2012 and Taiwan application serial no. 101130468, filed on Aug. 22, 2012. The entirety of each of the above-mentioned patent applications is hereby incorporated by reference herein and made a part of this specification.

BACKGROUND OF THE INVENTION

1. Field of the Disclosure

The document relates to an electronic device; and more particularly, to an active device, a driving circuit structure and a display panel.

2. Description of Related Art

According to recent researches, an oxide semiconductor thin film transistor (TFT) has relatively higher carrier mobility than that of the amorphous silicon (a-Si) TFT, and threshold voltage (Vth) uniformity of the oxide semiconductor TFT is better than that of the low temperature polycrystalline silicon (LTPS) TFT. For this reason, the oxide semiconductor TFT has potential for becoming a key element of electronic devices in the next generation.

However, when TFT is required to have high W/L ratio of channel width and channel length and is needed to be disposed in limited area, specific layout for sources and drains of the TFT is needed. However, parasitic currents may occur between sources and drains such that performance of TFT is impacted. As a result, even if channels of the TFT are fabricated with the oxide semiconductor materials, performance of the TFTs remains little enhancement.

SUMMARY OF THE INVENTION

The invention provides an active device having desirable W/L ratio of channel width and channel length, and desirable device characters.

The invention provides a driving circuit structure with an active device having high W/L ratio of channel width and channel length, and having desirable device characters.

The invention provides a display panel disposed with an active device having favorable device characters and having desirable quality.

The invention provides an active device disposed in a pre-determined device region of a substrate. The active device includes a gate, a gate insulation layer, a semiconductor layer, an etching stop layer, a source, and a drain. The gate includes a plurality of first directional portions and a plurality of second directional portions. The first directional portions and the second directional portions are connected alternatively to form a meandering pattern on the substrate, wherein the first directional portions are substantially parallel to each other, the second directional portions are substantially parallel to each other, and an extending direction of the first directional portions intersects with an extending direction of the second directional portions. The gate insulation layer covers the gate. The semiconductor layer is disposed on the gate insulation layer and is disposed above the gate. An area of the semiconductor layer substantially defines the pre-determined device region. The etching stop layer is disposed on the gate insulation layer and the semiconductor layer and has a first contact opening and a second contact opening that both expose the semiconductor layer and are not connected with each other. The first contact opening has a plurality of first finger portions substantially parallel to the first directional portions and at least one first connecting portion connected with the first finger portion and substantially parallel to the second directional portions. The second contact opening has a plurality of second finger portions substantially parallel to the first directional portions and at least one second connecting portion connected with the second finger portions and substantially parallel to the second directional portions. Each of the first finger portions and one of the second finger portions are disposed on two sides of one of the first directional portions. The source is disposed on the etching stop layer and is in contact with the semiconductor layer via the first contact opening. The drain is disposed on the etching stop layer and is in contact with the semiconductor layer via the second contact opening. The source and the drain are separated from each other.

The substrate has at least one pre-determined device region and at least one element region, and the driving circuit structure is utilized to drive at least one element in the element region, wherein the driving circuit structure includes at least one active device disposed in the pre-determined device region. The active device includes a gate, a gate insulation layer, a semiconductor layer, an etching stop layer, a source and a drain. The gate includes a plurality of first directional portions and a plurality of second directional portions. The first directional portions and the second directional portions are connected alternately to form a meandering pattern on the substrate, wherein the first directional portions are substantially parallel to each other, the second directional portions are substantially parallel to each other, and an extending direction of the first directional portions intersects an extending direction of the second directional portions. The gate insulation layer covers the gate. The semiconductor layer is disposed on the gate insulation layer and above the gate. An area of the semiconductor layer substantially defines the pre-determined device region. The etching stop layer is disposed on the gate insulation layer and the semiconductor layer and has one first contact opening and one second contact opening both exposing the semiconductor layer and not connected with each other. The first contact opening has a plurality of first finger portions substantially parallel to the first directional portions and at least one first connecting portion connected with the first finger portion and substantially parallel to the second directional portions. The second contact opening has a plurality of second finger portions substantially parallel to the first directional portions and at least one second connecting portion connected with the second finger portion and substantially parallel to the second directional portions. Each of the first finger portions and one of the second finger portions are disposed on two sides of one of the first directional portions, respectively. The source is disposed on the etching stop layer and is in contact with the semiconductor layer via the first contact opening The drain is disposed on the etching stop layer and is in contact with the semiconductor layer via the second contact opening. The source and the drain are separated from each other.

The invention further provides a display panel including a substrate and a plurality of pixels disposed on the substrate. The substrate has at least one display region and at least one periphery region disposed at peripheries of the display region, and the pixels are disposed in the display region, wherein each pixel includes at least one active device and at least one pixel electrode electrically connected with the active device. The active device includes a gate, a gate insulation layer, a semiconductor layer, an etching stop layer, a source and a drain.

The gate includes a plurality of first directional portions and a plurality of second directional portions. The first directional portions and the second directional portions are connected alternately to form a meandering pattern on the substrate, wherein the first directional portions are substantially parallel to each other, the second directional portions are substantially parallel to each other, and an extending direction of the first directional portions intersects an extending direction of the second directional portions. The gate insulation layer covers the gate. The semiconductor layer is disposed on the gate insulation layer and above the gate. An area of the semiconductor layer substantially defines a pre-determined device region. The etching stop layer is disposed on the gate insulation layer and the semiconductor layer, and has one first contact opening and one second contact opening both exposing the semiconductor layer and not connected with each other. The first contact opening has a plurality of first finger portions substantially parallel to the first directional portions and at least one first connecting portion connected with the first finger portion and substantially parallel to the second directional portions. The second contact opening has a plurality of second finger portions substantially parallel to the first directional portions and at least one second connecting portion connected with the second finger portion and substantially parallel to the second directional portions. Each of the first finger portions and one of the second finger portions are disposed on two sides of one of the first directional portions, respectively. The source is disposed on the etching stop layer and is in contact with the semiconductor layer via the first contact opening. The drain is disposed on the etching stop layer and is in contact with the semiconductor layer via the second contact opening. The source and the drain are separated from each other.

In an embodiment of the invention, the gate insulation layer and the etching stop layer are further extended to a region outside the pre-determined device region, and the etching stop layer is in contact with the gate insulation layer at the region outside the device pre-determined region.

In an embodiment of the invention, parts of the second directional portions are connected with first ends of the first directional portions, the rest of the second directional portions are connected with second ends of the first directional portions, and each second directional portion is connected with two first directional portions to form the meandering pattern.

In an embodiment of the invention, the first connecting portion of the first contact opening and the second connecting portion of the second contact opening are disposed on two opposite sides of the first direction portions of the gate, respectively.

In an embodiment of the invention, the number of the at least one first connecting portion is plural and the first contact opening further includes a plurality of the first auxiliary connecting portion. Each first auxiliary connecting portion is connected with two of the first finger portions, and the first auxiliary portions and the first connecting portions are disposed on first and second ends of the first finger portions, respectively. The source can have a plurality of source finger patterns, and each source finger pattern is in contact with the semiconductor layer via one of the first auxiliary connecting portions and two first finger portions connected by the one of the first auxiliary connecting portions. In addition, the number of at least one second connecting portion can be plural, and the second contact opening further includes a plurality of the second auxiliary connecting portions. Each second auxiliary connecting portion is connected with two of the second finger portions, and the second auxiliary connecting portions and the second connecting portions are disposed on first ends and second ends of the second finger portions, respectively. Here, the drain can have a plurality of drain finger patterns, and each drain finger pattern is in contact with the semiconductor layer via one of the second auxiliary connecting portions and two second finger portions connected by the one of the second auxiliary connecting portions.

In an embodiment of the invention, the active device further includes a plurality of capacitor electrode patterns connected with the gate, wherein each of the capacitor electrode patterns is disposed between two adjacent first directional portions and a first capacitor structure is defined by overlapping the capacitor electrode patterns and the source.

In an embodiment of the invention, the semiconductor layer has a plurality of finger openings, and each of the finger openings corresponds to one of the first finger portion of the first contact opening and has a size substantially smaller than the one of the first finger portions. The source has a portion located inside the finger openings and another portion in contact with the semiconductor layer.

In an embodiment of the invention, the etching stop layer has at least one capacitor opening exposing an area of the first capacitor structure.

In an embodiment of the invention, the display panel further includes a driving circuit structure disposed in a peripheral region to drive the pixels. The driving circuit structure includes a peripheral active device and the peripheral active device includes a peripheral gate, a peripheral semiconductor layer, a peripheral source and a peripheral drain. The peripheral gate includes a plurality of first peripheral directional portions and a plurality of second peripheral directional portions. The first peripheral directional portions and the second peripheral directional portions are connected alternately to form a peripheral meandering pattern on the substrate. The gate insulation layer further covers the peripheral gate, wherein the first peripheral directional portions are substantially parallel to each other, the second peripheral directional portions are substantially parallel to each other, and an extending direction of the first peripheral directional portions intersects an extending direction of the second peripheral directional portions. The peripheral semiconductor layer is disposed on the gate insulation layer and above the peripheral gate. An area of the peripheral semiconductor layer substantially defines a peripheral pre-determined device region where the peripheral active device is. The etching stop layer is extended to the periphery region and further includes one first peripheral contact opening and one second peripheral contact opening both exposing the peripheral semiconductor layer and not connected with each other. The first peripheral contact opening has a plurality of first peripheral finger portions substantially parallel to the first peripheral directional portions and at least one first peripheral connecting portion connected with the first peripheral finger portion and substantially parallel to the second peripheral directional portions. The second peripheral contact opening has a plurality of second peripheral finger portions substantially parallel to the first peripheral directional portions and at least one second peripheral connecting portion connected with the second peripheral finger portion and substantially parallel to the second peripheral directional portion, wherein each of the first peripheral finger portions and one of the second peripheral finger portions are disposed on two sides of one of the first peripheral directional portions, respectively. The peripheral source is disposed on the etching stop layer and is in contact with the peripheral semiconductor layer via the first peripheral contact opening. The peripheral drain is disposed on the etching stop layer and is in contact with the peripheral semiconductor layer via the second peripheral contact opening, and the peripheral source and the peripheral drain are separated from each other.

In an embodiment of the invention, the etching stop layer is in contact with the gate insulation layer at a region outside the peripheral pre-determined device region and the pre-determined device region.

In an embodiment of the invention, parts of second peripheral directional portions are connected with first ends of the first peripheral directional portions, the rest of the second peripheral directional portions are connected with second ends of the first peripheral directional portions, and each second directional portion is connected with two first directional portions to form the peripheral meandering pattern.

In an embodiment of the invention, the at least one first peripheral connecting portion of the first peripheral contact opening and the at least one second peripheral connecting portion of the second peripheral contact opening are disposed on two opposite sides of one of the first peripheral directional portions of a peripheral gate.

In an embodiment of the invention, the number of the at least one first peripheral connecting portion is plural and the first peripheral contact opening further includes a plurality of first peripheral auxiliary connecting portions. Each first peripheral auxiliary connecting portion is connected with two of the first peripheral finger portions. The first peripheral auxiliary connecting portions and the first peripheral connecting portions are disposed on first ends and second ends of first peripheral finger portions, respectively.

In an embodiment of the invention, the peripheral source has a plurality of peripheral source finger patterns and each peripheral source finger pattern is in contact with a peripheral semiconductor layer via one of first peripheral auxiliary connecting portions and the two first peripheral finger portions connected by the one of the first peripheral auxiliary connecting portions.

In an embodiment of the invention, the number of the at least one second peripheral connecting portion is plural and the second peripheral contact opening further includes a plurality of second peripheral auxiliary connecting portions. Each second peripheral auxiliary connecting portion is connected with two of the second peripheral finger portions, and the second peripheral auxiliary connecting portions and the second peripheral connecting portions are disposed on first ends and second ends of the second peripheral finger portions, respectively.

In an embodiment of the invention, the peripheral drain has a plurality of peripheral drain finger patterns and each peripheral drain finger pattern is in contact with the peripheral semiconductor layer via one of second peripheral auxiliary connecting portions and the second peripheral finger portions connected by the one of the second peripheral auxiliary connecting portions.

In an embodiment of the invention, the driving circuit structure further includes a plurality of capacitor electrode patterns connected with the peripheral gate, wherein each of the capacitor electrode patterns is disposed between two adjacent first peripheral directional portions and a first capacitor structure is defined by overlapping the capacitor electrode patterns and the peripheral source.

In an embodiment of the invention, the peripheral semiconductor layer has a plurality of finger openings. Each of the finger openings corresponds to one of the first peripheral finger portions of the first peripheral contact opening and has a size substantially smaller than the one of the first peripheral finger portion. The peripheral source has a portion located inside the finger portions and another portion in contact with the peripheral semiconductor layer.

In an embodiment of the invention, the driving circuit structure further includes a capacitor bottom electrode and a capacitor upper electrode located beside the peripheral pre-determined device region and respectively connected with the peripheral gate and the peripheral source. A second capacitor structure is defined by overlapping the capacitor bottom electrode and the capacitor upper electrode and a capacitance of the first capacitor structure is substantially smaller than the second capacitor structure.

In an embodiment of the invention, the etching stop layer has at least one capacitor opening exposing an area of at least one of the first capacitor structure and the second capacitor structure.

In view of the above, in the invention, an etching stop layer formed on a semiconductor layer substantially covers most area of the substrate such that a source and a drain of an active device are connected with the semiconductor layer via contact openings in the etching stop layer. Accordingly, the source and the drain substantially are disposed on the etching stop layer and thereby unnecessary parasitic currents produced between the source and the drain can be reduced so as to enhance the performance of the active device. In addition, an embodiment according to the invention includes the design of capacitor electrode patterns formed in part of the gaps of the structure of the gate. The capacitor electrode patterns can be overlapped with the source to form a first capacitor structure, which is conducive to efficiently utilize the layout space. The driving circuit structure and the display panel in the embodiments of the invention can also have favorable quality because of having such an active device.

In order to make the aforementioned features and advantages of the invention more comprehensible, embodiments accompanied with figures are described in details below.

BRIEF DESCRIPTION OF THE DRAWINGS

FIG. 2A to FIG. 5A are schematic top views illustrating each step of a fabricating process of an active device according to an embodiment of the invention.

FIG. 2B to FIG. 5B are schematic cross-sectional views taken along lines A-A' depicted in top views of FIG. 2A to FIG. 5A, respectively.

FIG. 7A to FIG. 8A are schematic top views illustrating each step of a fabricating process of an active device according to an embodiment of the invention.

FIG. 7B to FIG. 8B are schematic cross-sectional views taken along lines B-B' depicted in top views of FIG. 7A to FIG. 8A.

FIG. 9A to FIG. 12A are schematic top views illustrating each step of a fabricating process of an active device including a capacitor structure according to an embodiment of the invention.

FIG. 9B to FIG. 12B are schematic cross-sectional views taken along lines C-C' depicted in top views of FIG. 9A to FIG. 12A.

FIG. 13A to FIG. 15A are schematic top views illustrating each step of a fabricating process of an active device including a capacitor structure according to an embodiment of the invention.

FIG. 13B to FIG. 15B are schematic cross-sectional views taken along lines D-D' depicted in top views of FIG. 13A to FIG. 15A.

DETAILED DESCRIPTION OF THE EMBODIMENTS

A thin film transistor (TFT) can control the transmissions of electronic signals and usually plays a role of switch in the electronic device to carry out needed functions. Since TFT can be applied in broad fields, embodiments below depicting an active device disposed in a display panel are taking as examples to illustrate an active device design provided in the invention. The active device according to the invention can be disposed in at least one of the display region and the peripheral region of a display panel. In specific, the active device of the invention can be disposed in the peripheral region, the display region or both. In an embodiment, the active device as depicted in the following embodiments can be preferably disposed in the peripheral region. Furthermore, the active device illustrated in the embodiments below can also be applied to other electronic devices, and the invention is not limited thereto.

Figure 1:
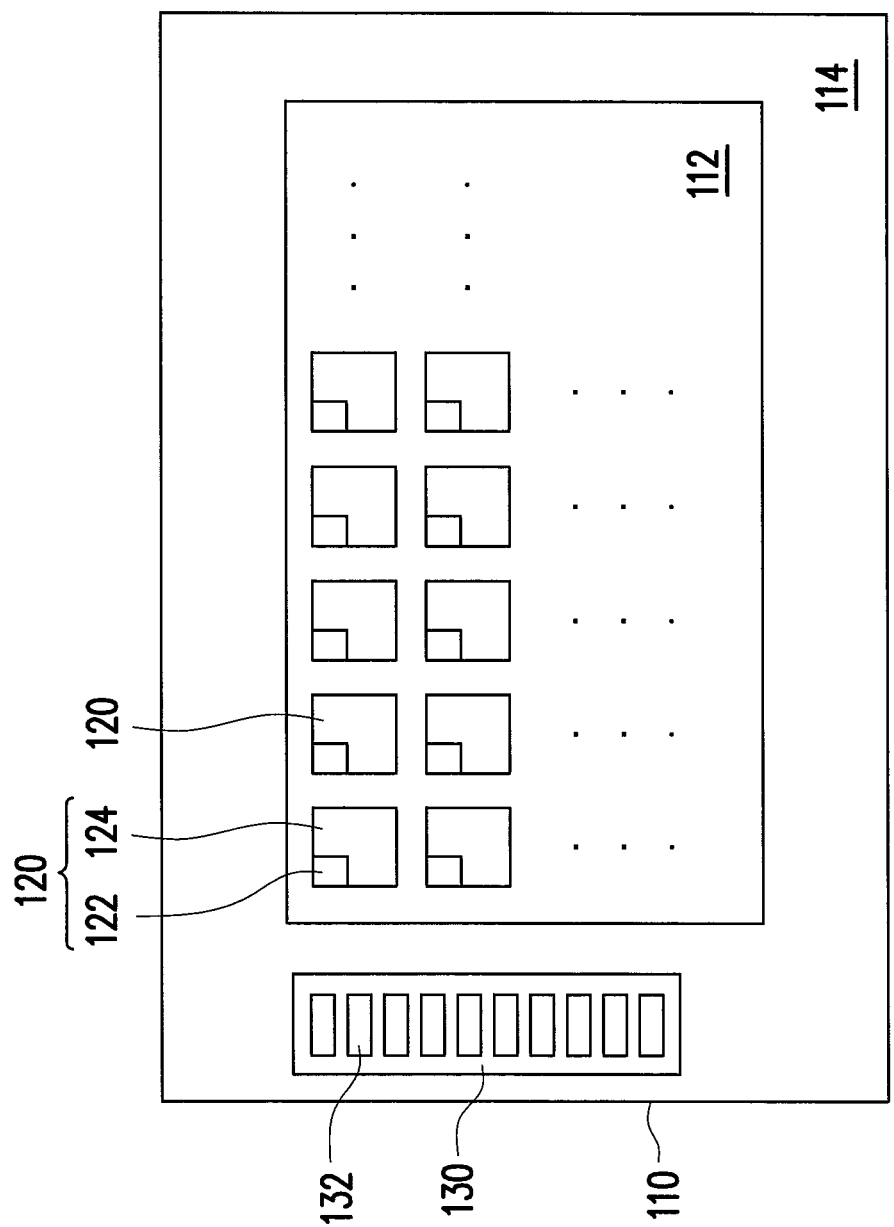
FIG. 1 is a schematic view illustrating an electronic device according to an embodiment of the invention.

FIG. 1 is a schematic view illustrating an electronic device according to an embodiment of the invention. Referring to FIG. 1, the electronic device of the present embodiment is, for example, a display panel 100. The display panel 100 includes a substrate 110, pixels 120 disposed on the substrate 110 and a driving circuit structure 130 utilized to drive these pixels 120. The present embodiment is illustrated by taking the display panel 100 as an example. Therefore, elements disposed on the substrate 110 include a plurality of pixels 120. However, the electronic devices in other embodiments can be a sensing apparatus, a touch apparatus, a photoelectric conversion apparatus, or other suitable apparatus. Therefore, the elements disposed on the substrate 110 and driven by the driving circuit structure 130 can be, for example, touch elements, sensing elements, photoelectric conversion elements, or other suitable elements. In other words, the invention is not limited by illustrated elements shown in FIG. 1.

In the present embodiment, the substrate 110 has a display region 112 and a periphery region 114 located at peripheries of the display region 112. A plurality of the pixels 120 are substantially arranged in an array in the display region 112 and the driving circuit structure 130 is disposed in the periphery region 114. The marked display region 112 as shown in FIG. 1 substantially indicated a region disposed with the pixels 120 and the periphery region 114 substantially indicates a region outside the region on which the pixels 120 are disposed. Therefore, the boundary between the display region 112 and the periphery region 114 are not limited as defined by specific elements, and the boundary can be set according to a disposition area of the pixels 120. In addition, the display region 112 herein indicates a region where display elements (known as the pixels 120) are disposed in the display panel 100, and thus can be named as an element region.

Each of the pixels 120 substantially includes at least one active device 122 and at least one pixel electrode 124 electrically connected with the active device 122. The active device 122 can control whether electronic signals are transmitted into the pixel electrodes 124 so as to drive display media (not illustrated herein) of the display panel 100 via electronic signals obtained by the pixel electrodes 124, which achieves the image display function. In addition, the driving circuit structure 130 disposed in the periphery region 114 can include at least one active device 132 utilized to drive the pixels 120. Herein, the active device 132 located in the peripheral region 114 can also be named as a peripheral active device. In addition, the region at which the active device 122 is disposed can be named as an (active) device region (or namely pre-determined device region) and the location of the active device 132 can be called a peripheral (active) device region (or namely peripheral pre-determined device region).

Specifically, the active device 122 of the pixels 120 can be driven via a plurality of scan lines (not illustrated herein) and a plurality of data lines (not illustrated herein), wherein the scan lines (not illustrated herein) are utilized to control whether to turn on the active device 122 or not. When the active device 122 is turned on, electronic signals transmitted on the data lines (not illustrated herein) can be input into the pixel electrodes 124. Here, the driving circuit structure 130 can be utilized to drive the scan lines (not illustrated herein) or the data lines (not illustrated herein) to transmit corresponded signals in a corresponding time slot. Therefore, the driving circuit structure 130, in terms of naming, can be called a scanning driving circuit structure or a data driving circuit structure.

To implement desirable display quality, the active device 122 and the active device 132 have to obtain desirable device characteristics. As a result, different embodiments are disclosed below to explain designs of the active device according to the spirit of the invention. It should be noted that the active device described in the following embodiments can be implementing methods of at least one of the active device 122 and the active device 132; that is, the active device described in the following embodiments can be applied to the active device 122, the active device 132, or both of the active devices 122 and 132, and types of the aforementioned 122 and 132 can be the same or different. In addition, due to that the electronic device described in the invention is not limited to the illustrated display panel in FIG. 1, the active device described in the following specific embodiments can also be the embodiments of the active device in other electronic devices excluding the display panel.

FIG. 2A to FIG. 5A are schematic top views illustrating each step of a fabricating process of an active device according to an embodiment of the invention. FIG. 2B to FIG. 5B are schematic cross-sectional views along lines A-A' of schematic top views of FIG. 2A to FIG. 5A, respectively. First referring to FIG. 2A and FIG. 2B. A gate 210 is formed on a substrate 10, wherein the substrate 10 can be a substrate of any electronic device. For example, when an electronic device is the display panel 100 as illustrated in FIG. 1, the substrate 10 can be regarded as the substrate 110 in FIG. 1.

In this step, the gate 210 can be formed by a patterned conductive layer (not illustrated herein) fabricated on the substrate 10. Therefore, a fabricating method of the gate 210 can include forming a conductive material layer and patterning the conductive material layer, wherein the patterning of the conductive material layer can include a photolithography and an etching processes. In addition, the gate 210 can also be formed by applying a conductive material on a partial area of the substrate 10 so as to have a particular pattern via a printing method, an ink jet method, a laser ablation method, a lift-off method, or other suitable methods. Specifically, the gate 210 includes a plurality of first directional portions 212 and a plurality of second directional portions 214. The first directional portions 212 and the second directional portions 214 are connected alternately and form a meandering pattern (or namely wandering, winding, bending, zigzag, curve-like, crooked pattern) S1 (as shown in a schematic top view of FIG. 2A) on the substrate 10. Here, the first directional portions 212 are substantially parallel with each other and the second directional portions 214 are substantially parallel to each other, and an extending direction D1 of the first directional portions 212 intersects an extending direction D2 of the second directional portions 214.

It should be noted that a portion of the second directional portions 214 is connected with the first ends of the first directional portions 212 at a left side in the figure, and the rest of the second directional portions 214 is connected with the second ends of the first directional portions 212 at a right side in the figure. Also, each second directional portion 214 is connected with two first directional portions 212 to form the meandering pattern S1. Any two adjacent first directional portions 212 in the wandering pattern S1 has a gap (not marked herein) with an opening and the openings of two most adjacent gaps are facing toward different directions; that is, one of openings of the two most adjacent gaps faces toward the marker D1 and the other opening of the two most adjacent gaps faces against the marker D1, such that the gaps are alternately arranged and shapes of gaps can have any shapes, for examples, a shape of polygon or a shape having a curvature. In other words, the gate 210 is substantially disposed in an area of a pre-determined shape, such as a rectangular area, and a width and a length of the rectangular area are substantially parallel to an extending direction D1 and an extending direction D2. In other embodiments, an area of a pre-determined shape can be any shape, such as a shape of polygon or a shape having a curvature. In addition, due to a design of meandering pattern S1, an extending straight line along the extending direction D2 can cut through a plurality of the first directional portions 212 of the gate 210 (as shown in FIG. 2B). Such a design of the wandering pattern S1 allows a considerable long path length in a limited disposition region and helps reduce needed disposition region for a device.

Figure 3A:
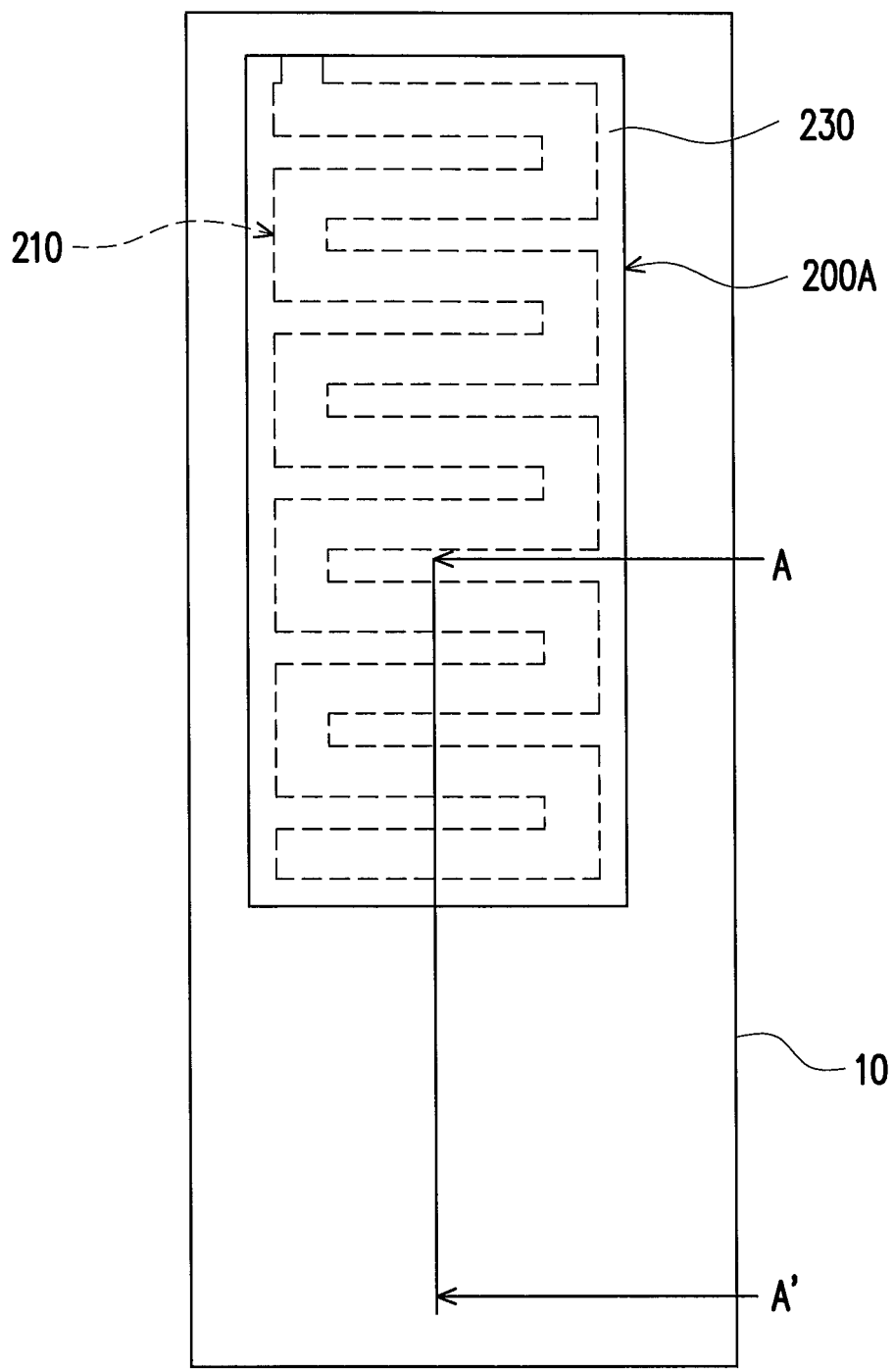
Figure 3B:
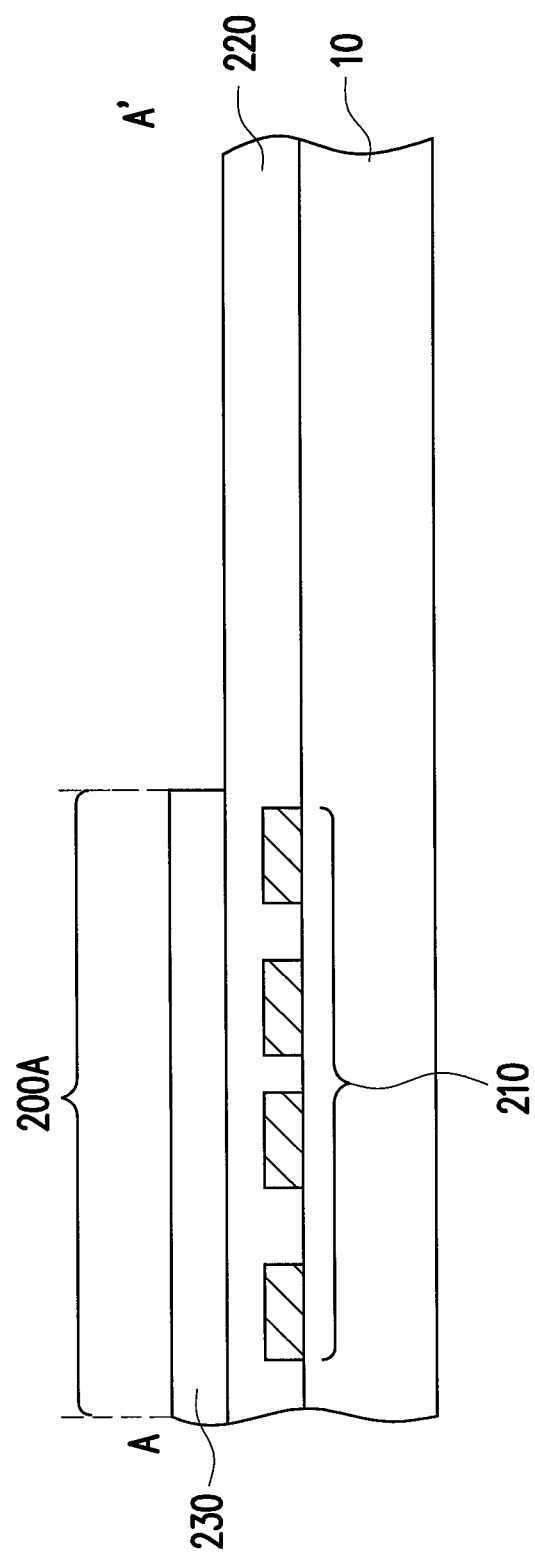

Next, referring to FIG. 3A and FIG. 3B together. A gate insulation layer 220 covering the gate 210 and a semiconductor layer 230 disposed on the gate insulation layer 220 are formed on the substrate 10. The semiconductor layer 230 is disposed above the gate 210. In the top view (such as FIG. 3A), areas of the semiconductor layer 230 and the gate 210 substantially overlap with each other. In other words, the semiconductor layer 230 herein also has a pre-determined pattern, which collocates with the area of the pre-determined shape of the gate 210. As such, a device disposition region 200A having a rectangular pattern is defined and the device disposition region 200A substantially is a region at which the gates 210 are disposed. In addition, the semiconductor layer 230 can have a single-layer or multi-layer structures and preferred, a material of the semiconductor layer 230 can be an oxide semiconductor material. However, in other embodiments, a material of the semiconductor layer 230 can also be amorphous silicon, polycrystalline silicon, microcrystalline silicon, monocrystalline silicon, nano crystalline silicon, organic semi-conductive material, other suitable materials, or a combination of at least two of the above.

Figure 4A:
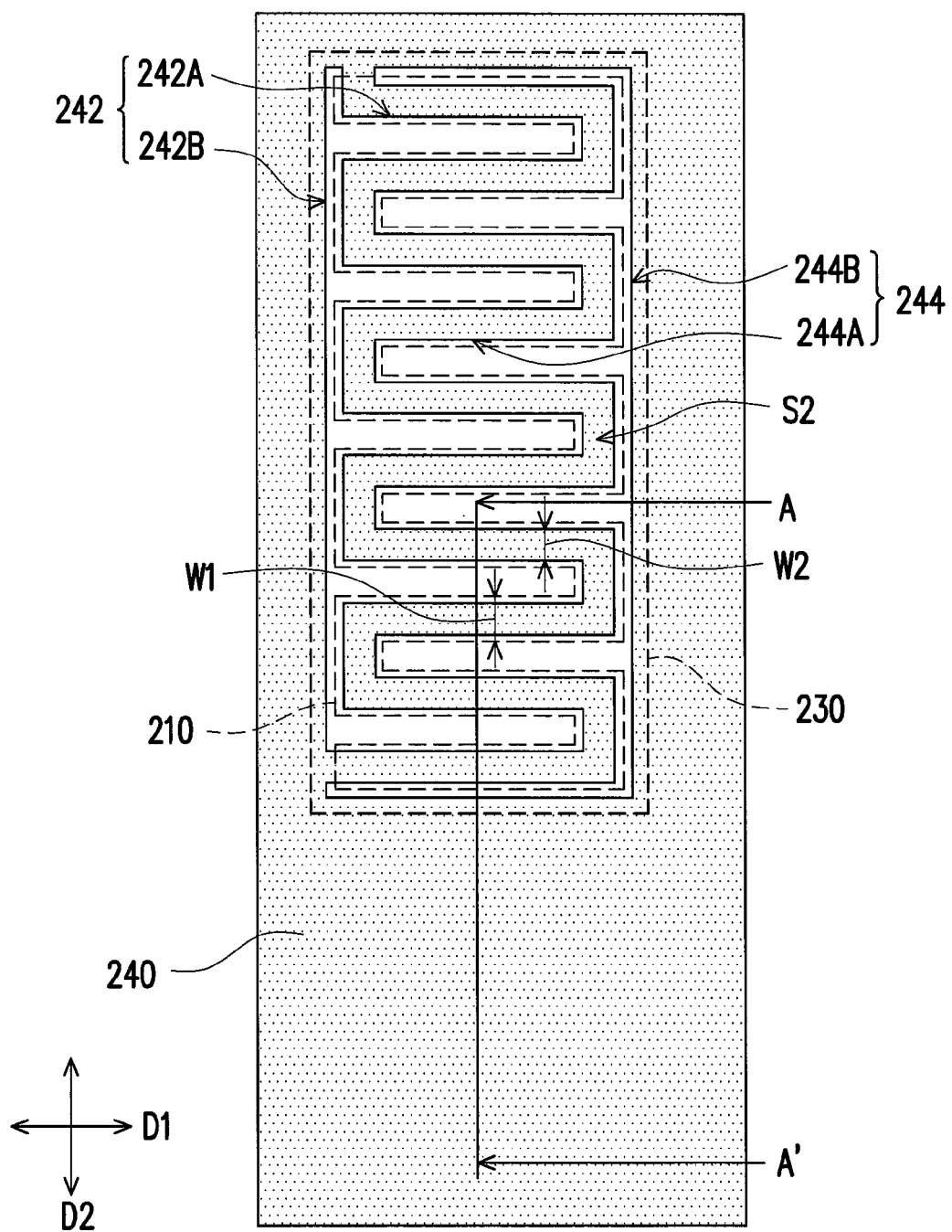
Figure 4B:
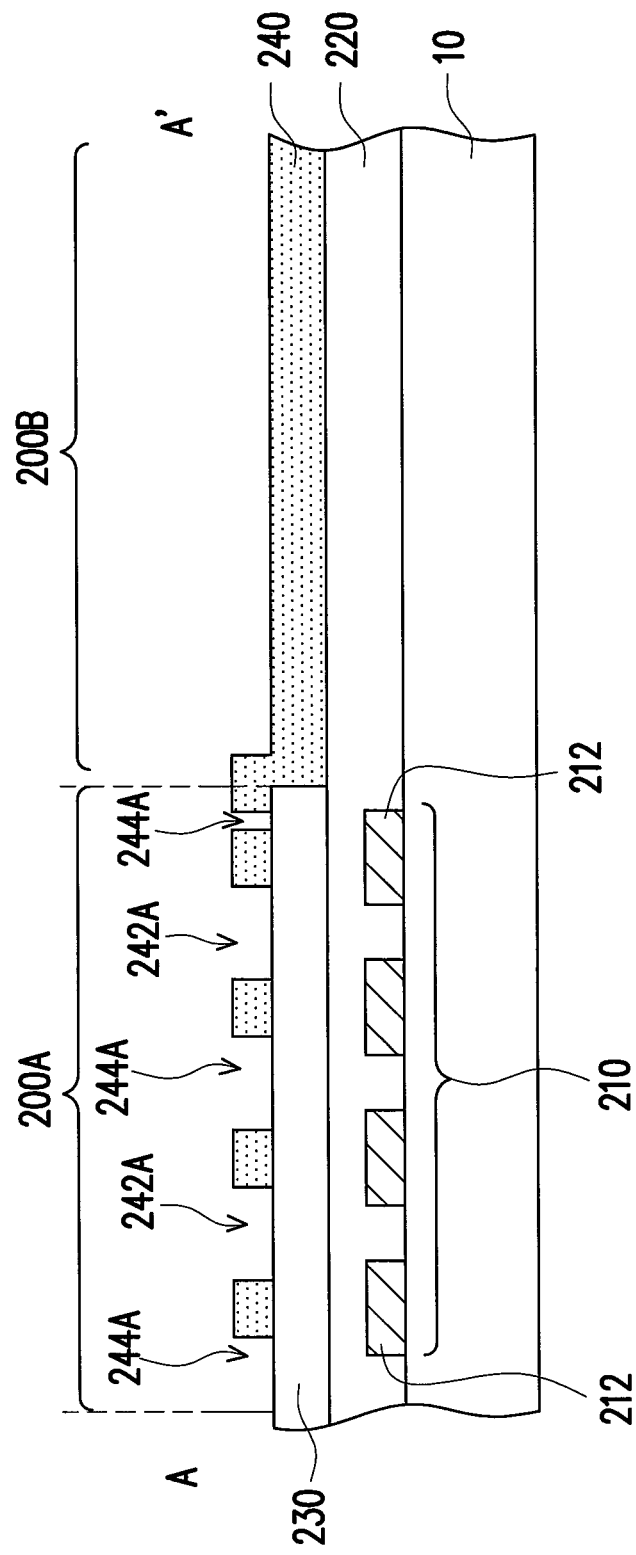

Next, referring to FIG. 4A and FIG. 4B, an etching stop layer 240 is formed on the substrate 10. The etching stop layer 240 is disposed on the semiconductor layer 230 and is extended to a region outside the device region (or namely pre-determined device region) 200A. Substantially, the etching stop layer 240 covers most area of the substrate 10. Consequently, at the region (for example, a region 200B) outside the device region 200A defined by the semiconductor layer 230, the etching stop layer 240 is in contact with the gate insulation layer 220. Specifically, the etching stop layer 240 has one first contact opening 242 and one second contact opening 244 both exposing the semiconductor layer 230 and not connected with each other, wherein FIG. 4A indicates a relationship between the dispositions of the gates 210 and the two contact openings 242 and 244.

The first contact opening 242 has a plurality of first finger portions 242A and one first connecting portion 242B. The first finger portions 242A are substantially parallel to the extending direction D1 of the first directional portions 212 of the gates 210, and the first connecting portion 242B is connected with all of the first finger portions 242A and is substantially parallel to the extending direction D2 of the second directional portions 214 of the gates 210. In other words, the first finger portions 242A corresponds to a portion of the gaps of the gates 210, and the first connecting portion 242B corresponds to the second directional portions 214 located at one side of the gate 210.

The second contact opening 244 has a plurality of second finger portions 244A and one second connecting portion 244B. The second finger portions 244A are substantially parallel to the extending direction D1 of the first directional portions 212 of the gates 210 and the second connecting portion 244B is connected with all of the first finger portions 242A and is substantially parallel to the extending direction D2 of the second directional portions 214 of the gates 210. In other words, the second finger portions 244A correspond to another portion of the gaps of the gates 210 and the second contact portion 244B corresponds to the second directional portions 214 located at the other side of the gate 210.

The first connecting portion 242B of the first contact opening 242 and the second connecting portion 244B of the second contact opening 244 are disposed at two opposite sides of these first directional portions 212 of the gate 210, respectively. In other words, the first connecting portion 242B and the second connecting portion 244B are disposed in the area of the pre-determined shape, such as two opposite sides of the rectangular device disposition region 200A, and the first finger portions 242A and the second finger portions 244A both are disposed between the first connecting portion 242B and the second connecting portion 244B. Herein, the first finger portions 242A can be regarded as finger patterns pointing from the first connecting portion 242B to the second connecting portion 244B and the second finger portions 244A can be regarded as finger patterns pointing from the second connecting portion 244B to the first connecting portion 242B.

In addition, each of the first finger portions 242A and one of the second finger portions 244A are disposed at two opposite sides of one of the first directional portions 212 of the gate 210, respectively. The first finger portions 242A and the second finger portions 244A are arranged alternately along the extending direction D2. Each first finger portion 242A is disposed between two adjacent first directional portions 212 of the gate 210 and each second finger portion 244A is also disposed between two adjacent first directional portions 212 of the gate 210. As a result, as shown in FIG. 4A, the etching stop layer 240 can define a meandering pattern (or namely wandering, winding, bending, zigzag, curve-like, crooked pattern) S2 by the configurations of the first contact opening 242 and the second contact opening 244, wherein, according to FIG. 4A, a path length of the wandering pattern S2 substantially conforms to a path length of the wandering pattern S1, but a line width W1 of the wandering pattern S1 is substantially wider than a line width W2 of the wandering pattern S2. In other words, the wandering pattern S2 of the etching stop layer 240 substantially corresponds to the wandering pattern S1 of the gate 210, but both have different line width designs.

Figure 5A:
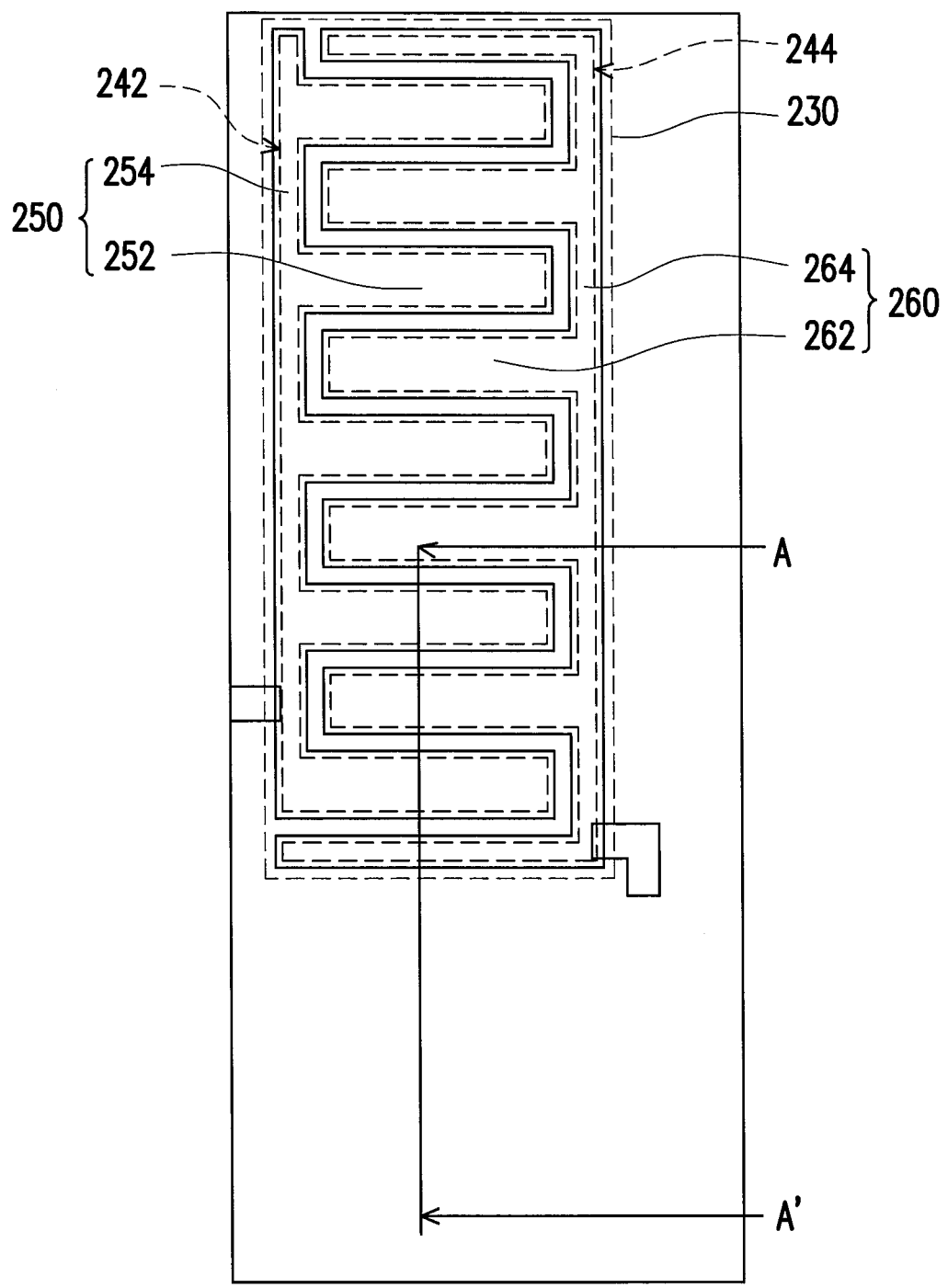
Figure 5B:
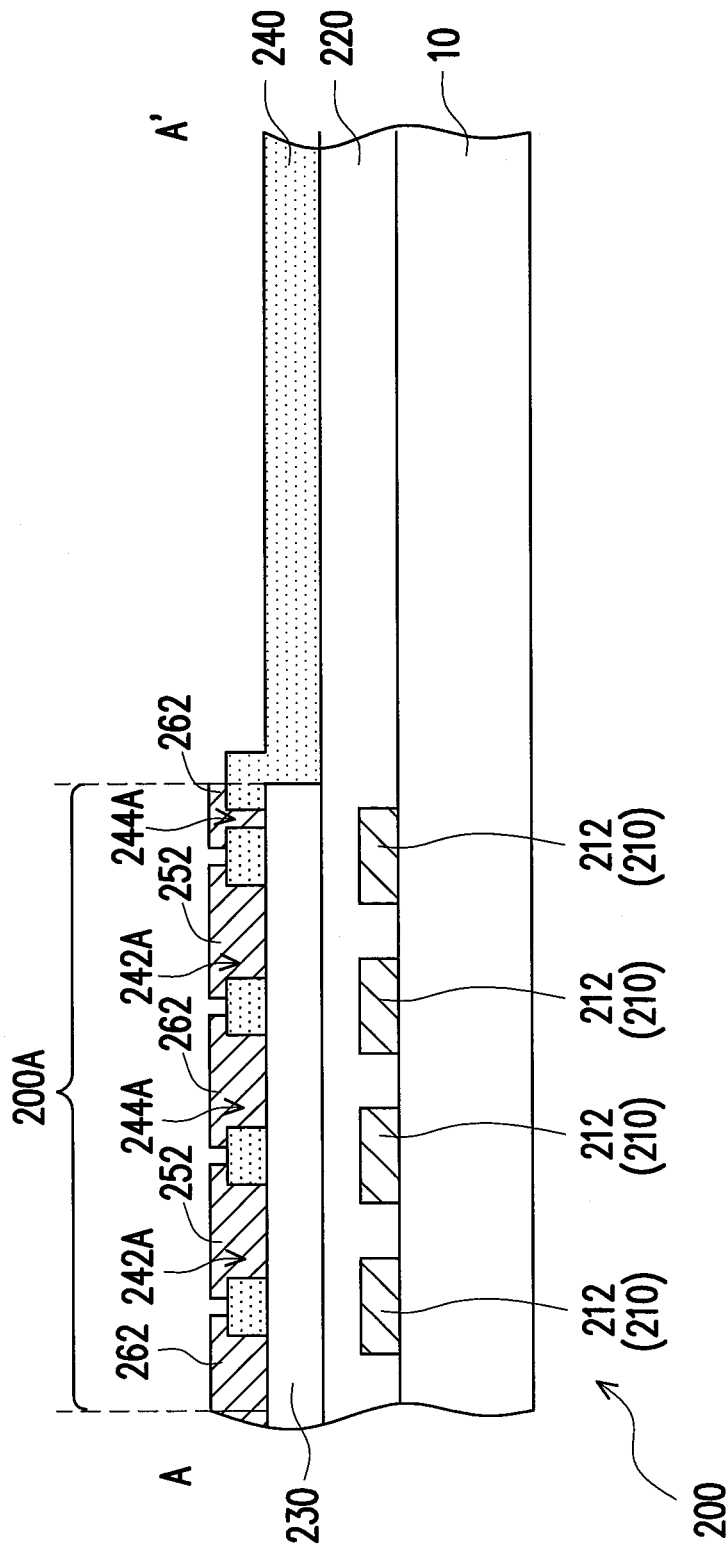

Thereafter, referring to FIG. 5A and FIG. 5B, a source 250 and a drain 260 are formed on the etching stop layer 240 so as to form the active device 200 in the device region 200A. The source 250 is disposed on the etching stop layer 240 and is in contact with the semiconductor layer 230 via the first contact opening 242. The drain 260 is in contact with the semiconductor layer 230 via the second contact opening 244, and the source 250 and the drain 260 are separated from each other. At this time, to clearly illustrate a disposition relationship of the source 250 and the drain 260 corresponding to the first and second contact openings 242 and 244, the gate 210 is omitted in FIG. 5A. Therefore, the disposition relationship of the gate 210 corresponding to the source 250 and the drain 260 can be understood by referring FIG. 4A and FIG. 5A at the same time.

The source 250 and the drain 260 can be formed by patterning a conductive layer via a photolithography and an etching processes. When the semiconductor layer 230 is fabricated with an oxide semiconductor material, the semiconductor layer 230 is likely etched during the etching process of patterning the conductive layer into the source 250 and the drain 260. However, in the present embodiment, the etching stop layer 240 is disposed on the semiconductor layer 230 so as to prevent the semiconductor layer 230 from being damaged in the process of fabricating the source 250 and the drain 260. In other words, the semiconductor layer 230 of the active device 200 can have a favorable quality. Certainly, if further considerations are needed for a quality factor of the semiconductor layer 230, a printing method, an ink-jetting method, a laser ablation method, a lift-off method, or other suitable methods can be utilized to fabricate the source 250 and the drain 260 on the semiconductor layer 230.

As shown in FIG. 5A, the source 250 can have a plurality of source finger patterns 252 and a source connecting pattern 254 connecting with all of the source finger patterns 252. Each source finger pattern 250 is in contact with the semiconductor layer 230 via one of the first finger portions 242A of the first contact opening 242. The source connecting pattern 254 is in contact with the semiconductor layer 230 via the first connecting portion 242B of the first contact opening 242. Consequently, a pattern formed by the source 250 can correspond to a pattern of the first contact opening 242, but both patterns have different line width designs.

The drain 260 can have a plurality of drain finger patterns 262 and a drain connecting pattern 264 connecting with all of the drain finger patterns 262. Each drain finger pattern 260 is in contact with the semiconductor layer 230 via one of the second finger portions 244A of the second contact opening 244. The drain connecting pattern 264 is in contact with the semiconductor layer 230 via the second connecting portion 244B of the second contact opening 242. Consequently, a pattern formed by the drain 260 can correspond to a pattern of the second contact opening 244. Also, the source 250 and the drain 260 are separated from each other rather than being connected together. It should be noted that a pattern formed by the drain 260 and a pattern of the second contact opening 244 have different line width designs.

In the present embodiment, the etching stop layer 240 substantially is disposed on most of the area of the substrate 10. Therefore, the source 250 and the drain 260 of the active device 200 are disposed on the etching stop layer 240 and are not in contact with the gate insulation layer 220. In addition, the source 250 and the drain 260 are in contact with the semiconductor layer 230 only via the first contact opening 242 and the second contact opening 244. As a result, when the active device 200 is operating, a parasitic current between the source 250 and the drain 260 can be effectively reduced and device characters of the active device 200 can be enhanced. In addition, in the present embodiment, a pair of electrodes (not shown) can be further disposed at the region (such as the region 200B) outside the device disposition region 200A. The pair of electrodes can sandwich the insulation layer (such as the gate insulation layer 220 and the etching stop layer 240) therebetween to form a storage capacitor. In an embodiment, one (upper electrode) of the pair of electrodes can be connected to the source 250 while the other (bottom electrode) of the pair of electrodes can be connected to the gate 210 in the active device.

Figure 6:
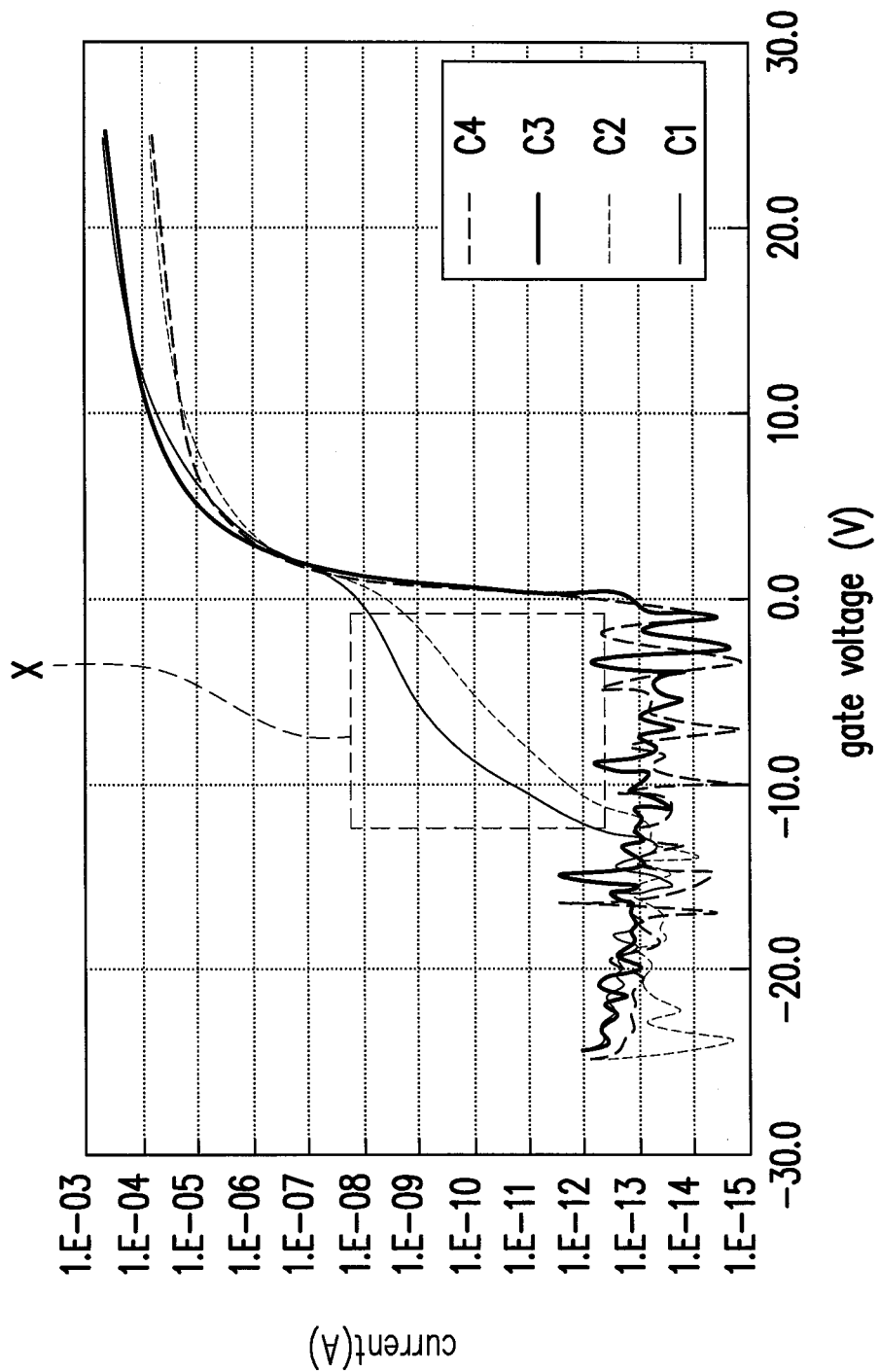
FIG. 6 illustrates a relationship between the current and the gate voltage of an active device (or named a characteristic curve of an active device).

For example, FIG. 6 illustrates a relationship between the current and the gate voltage of an active device (or called the characteristic curve of an active device). In FIG. 6, curves C1 and C2 are the characteristic curves when a parasitic current occurs between a source and a drain of an active device and curves C3 and C4 are the characteristic curves of the active device fabricated according to a design of the embodiment. A segment X in curves C1 and C2 indicates that device characters of the active device are not satisfactory. By contrast, as shown in curves C3 and C4, according to a design of the present embodiment, the active device can have rather satisfactory performance. Here, FIG. 2A to FIG. 5A and FIG. 2B to FIG. 5B are illustrated as only examples to describe implementing methods of one of active devices of the invention, but the invention is not limited thereto. Therefore, another implementing method of the active device is elaborated hereinafter with reference to accompanied figures.

Figure 7A:
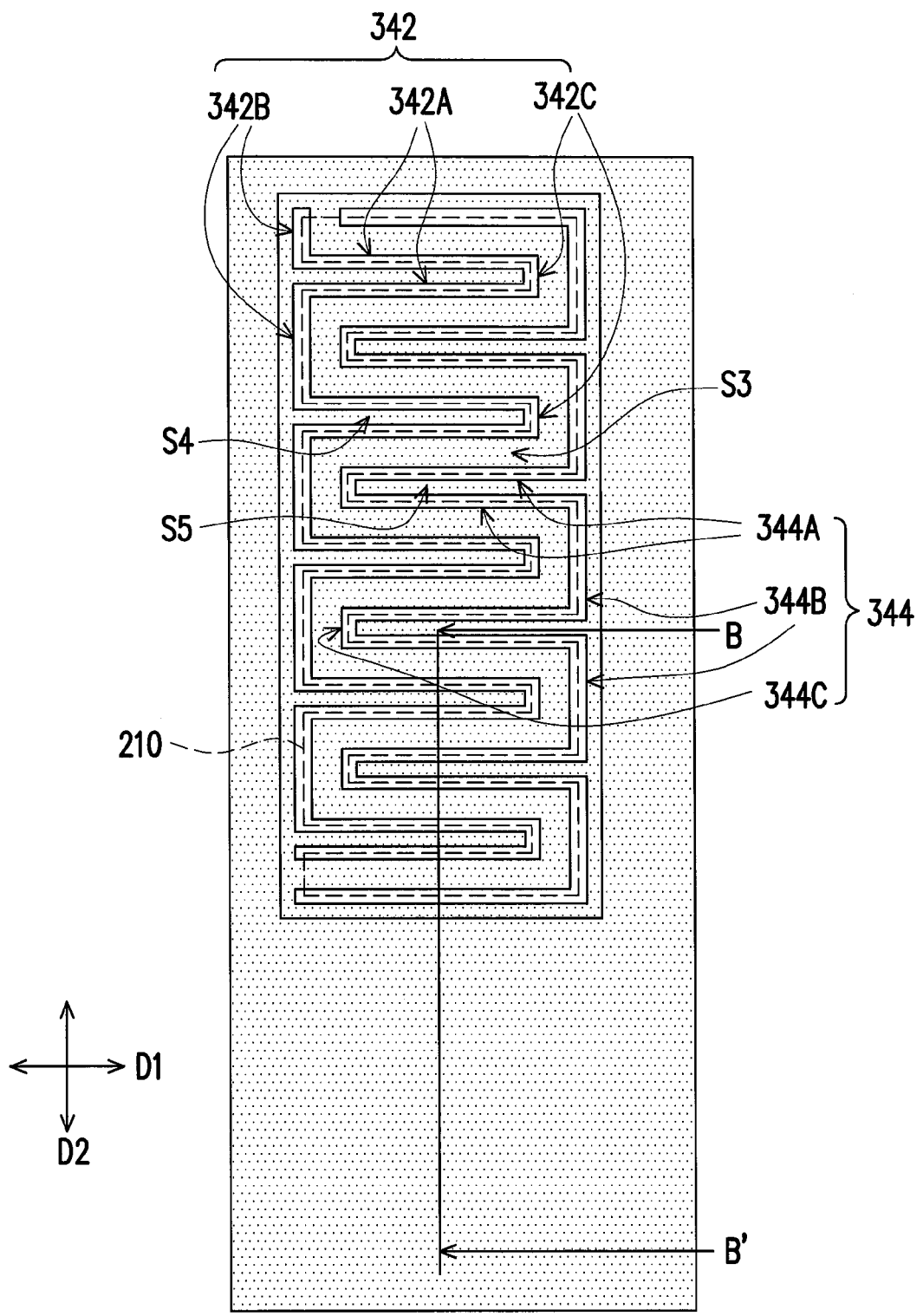

FIG. 7A to FIG. 8A are schematic top views illustrating each step of a fabricating process of an active device according to another embodiment of the invention. FIG. 7B to FIG. 8B are schematic cross-sectional views along lines B-B' of schematic top views of FIG. 7A to FIG. 8A, respectively. Referring to FIG. 7A and FIG. 7B, a gate 210, a gate insulation layer 220, a semiconductor layer 230, and an etching stop layer 340 are successively formed on the substrate 10. It should be noted that a fabricating method and a device layout of the gate 210, the gate insulation layer 220 and the semiconductor layer 230 of the present embodiment can refer to FIG. 2A to FIG. 3A and FIG. 2B to FIG. 3B, which is not further described herein.

Specifically, the etching stop layer 340 of the present embodiment has a first contact opening 342 and a second contact opening 344 both exposing the semiconductor layer 230 and not connected with each other. The first contact opening 342 has a plurality of first finger portions 342A, a plurality of first connecting portions 342B, and a plurality of first auxiliary connecting portions 342C. The second contact opening 344 has a plurality of second finger portions 344A, a plurality of second connecting portions 344B, and a plurality of second auxiliary connecting portions 344C.

The first finger portions 342A are substantially parallel to an extending direction D1 of the first directional portions 212 of the gates 210. The first connecting portions 342B and the first auxiliary connecting portions 342C are substantially parallel to an extending direction D2 of the second directional portions 214 of the gates 210. Each of the first connecting portions 342B is connected with a maximum of two first finger portions 342A and each of the first auxiliary connecting portions 342C is connected with two first finger portions 342A. The first connecting portions 342B and the first auxiliary connecting portions 342C are disposed at the first ends and the second ends of the first finger portions 342A, respectively.

The second finger portions 344A are substantially parallel to an extending direction D1 of the first directional portions 212 of the gates 210. The second connecting portions 344B and the second auxiliary connecting portions 344C are both substantially parallel to an extending direction D2 of the second directional portions 214 of the gates 210. Each of the second connecting portions 344B is connected with a maximum of two second finger portions 344A and each of the second auxiliary connecting portions 344C is connected with two second finger portions 344A. The second connecting portions 344B and the second auxiliary connecting portions 344C are disposed at the first ends and the second ends of the second finger portions 344A, respectively.

Figure 2A:
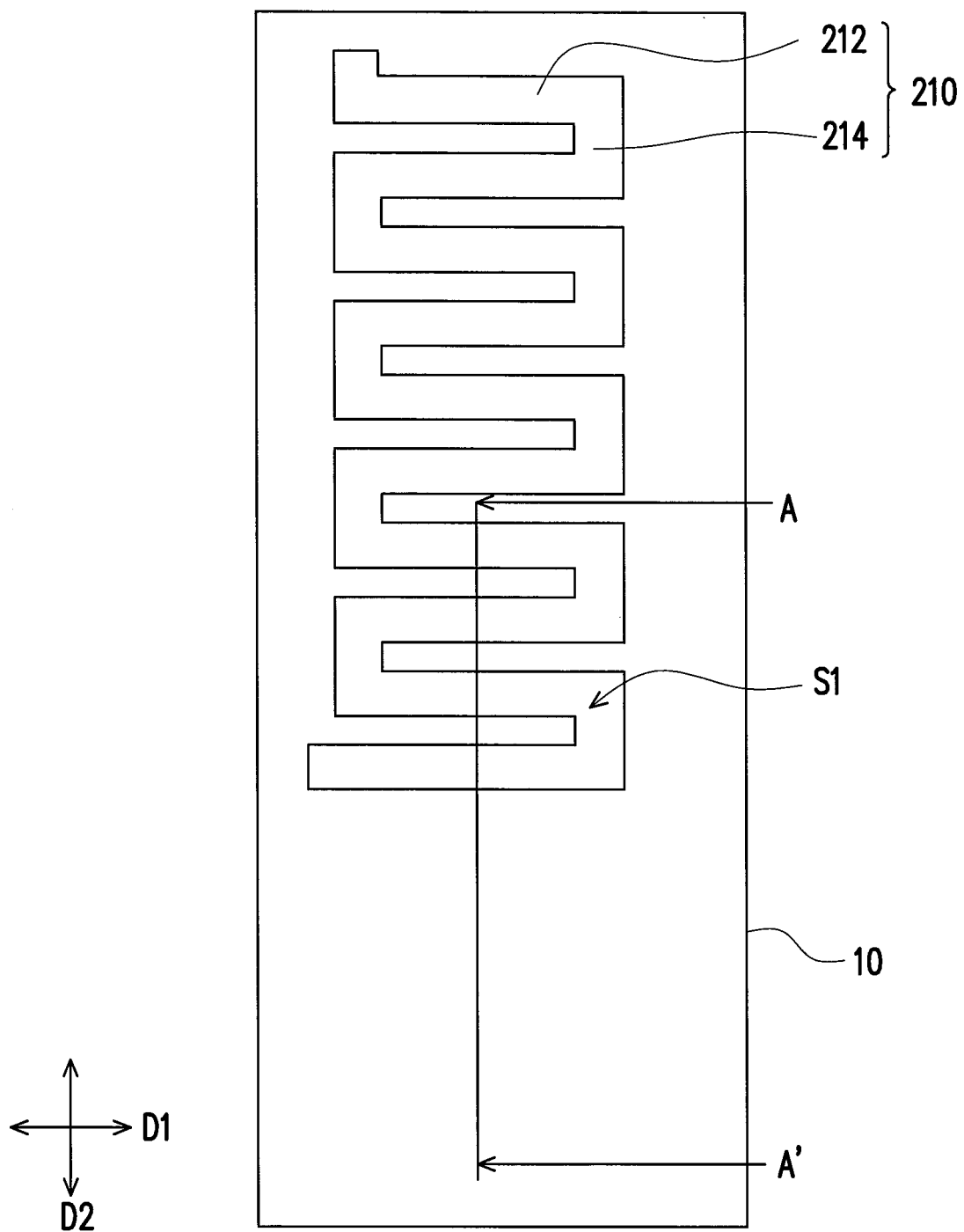
Figure 2B:
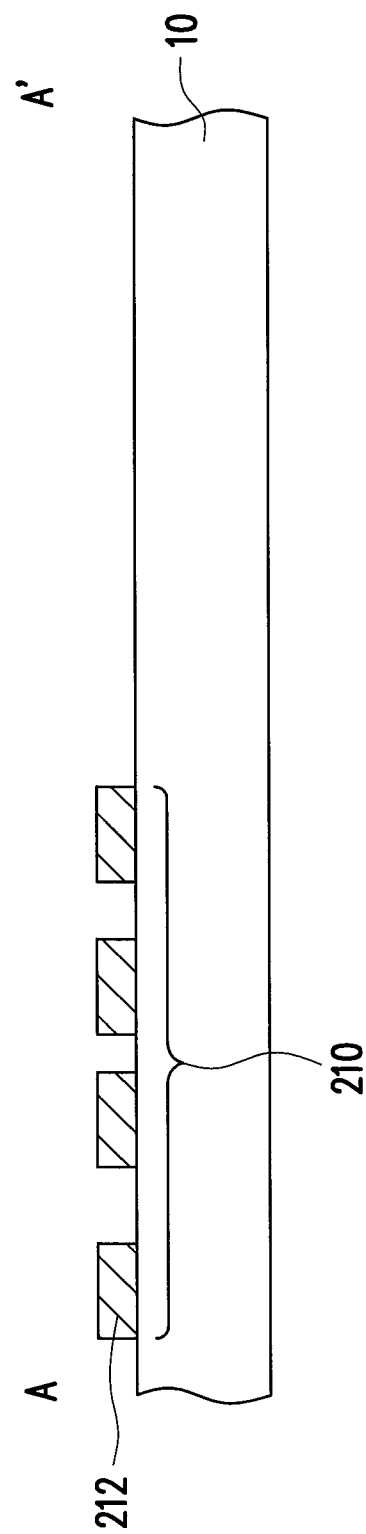
Figure 7B:
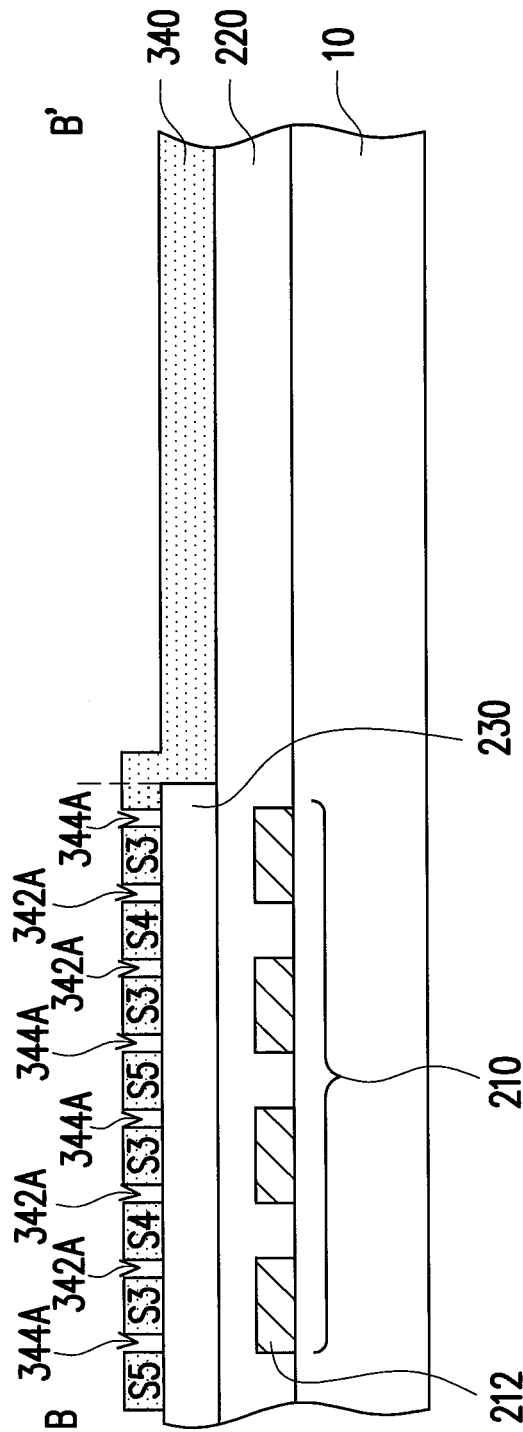

Here, the etching stop layer 340 between the first contact openings 342 and the second contact openings 344 defines a meandering pattern (or namely wandering, winding, bending, zigzag, curve-like, crooked pattern) S3, wherein the wandering pattern S3 substantially corresponds to the meandering pattern S1 defined by the gate 210 (as illustrated in FIG. 2A). In addition, a plurality of stripe patterns S4 between the first finger portions 342A of the first contact openings 342 and a plurality of stripe patterns S5 between the second finger portions 344A of the second contact openings 344 are further defined by the etching stop layer 340. In other words, in FIG. 4A, every two adjacent first directional portions 212 of the gates 210 has a gap (not shown herein). Above one of two adjacent gaps is configured with one first finger portion 242A of the first contact openings 242 of the etching stop layer 240 and above the other one of the two adjacent gaps is configured with one second finger portion 244A of the second contact openings 244 of the etching stop layer 240. In FIG. 7A of the present embodiment, a gap (not shown herein) is formed between every two adjacent first directional portions 212 of the gate 210. Above one of two adjacent gaps is configured with two first finger portion 242A of the first contact openings 242 and one stripe pattern S4 of the etching stop layer 240 and above the other one of the two adjacent gaps is configured with two second finger portions 244A of the second contact openings 244 and one stripe pattern S5 of the etching stop layer 240. As shown in FIG. 7B, the strip patterns S4, the wandering patterns S3, the strip patterns S5, and the wandering patterns S3 can be arranged sequentially when a cross-sectional view is taken along the extending direction D2, wherein shapes of the strip patterns S4 and the strip patterns S5 can be the same or different, and the shapes of at least one of the aforementioned patterns includes a polygonal shape, a shape having curvatures, or other suitable shapes, and shapes of the wandering pattern S3 include a polygonal shape, a shape having curvatures, or other suitable shapes.

Figure 8A:
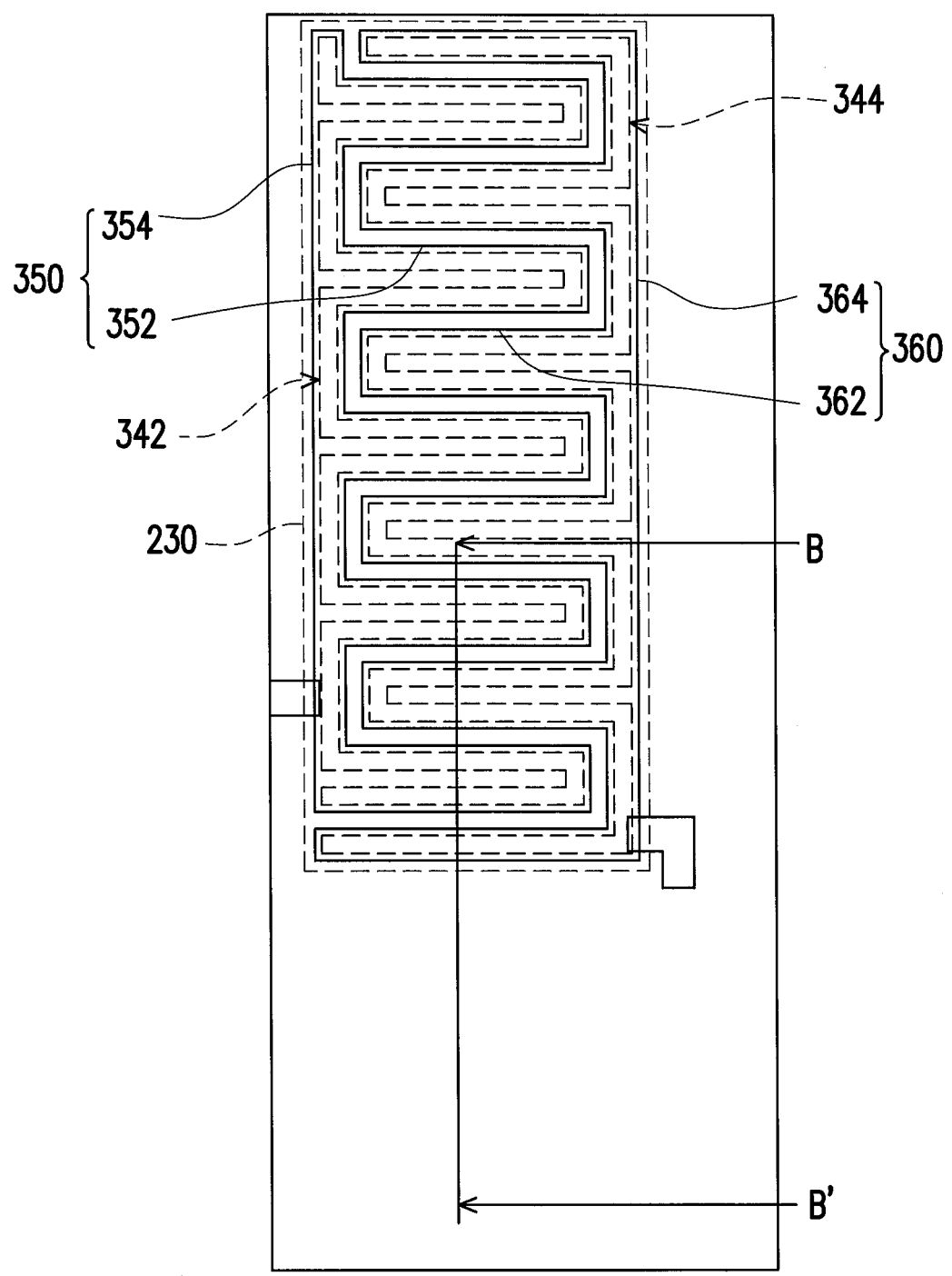
Figure 8B:
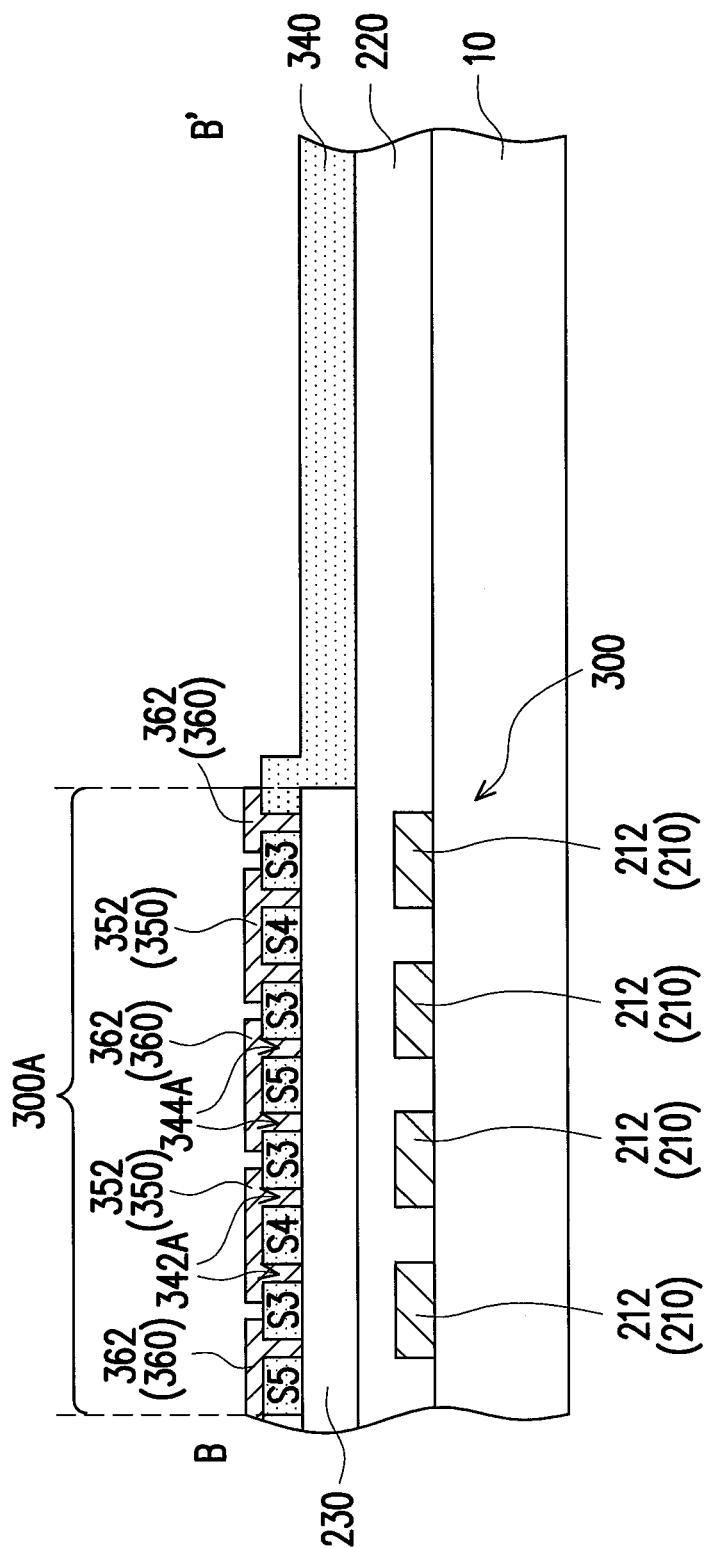

Next, referring to FIG. 8A and FIG. 8B, a source 350 and a drain 360 are formed on the etching stop layer 340 so as to form an active device 300 in a device region (or namely pre-determined device region) 300A, wherein the device region 300A is defined by the area of the semiconductor layer 230. The source 350 is disposed on the etching stop layer 340 and is in contact with the semiconductor layer 230 via the first contact opening 342. The drain 360 is in contact with the semiconductor layer 230 via the second contact opening 344, and the source 350 and the drain 360 are separated from each other. Here, to clearly illustrate a disposition relationship of the source 350 and the drain 360 corresponding to the first and the second contact openings 342 and 344, the gate 210 is not shown in FIG. 8A. For this reason, a disposition relationship of the gate 210 corresponding to the source 350 and the drain 360 can be understood by referring to FIG. 7A and FIG. 8A at the same time.

The source 350 can have a plurality of source finger patterns 352 and a source connecting pattern 354 connecting with the source finger patterns 352. Each of the source finger patterns 352 is in contact with the semiconductor 230 via one of the first auxiliary connecting portions 342C and two first finger portions 342A connected by the one of the first auxiliary connecting portions 342C in FIG. 7A. In other words, each of the strip patterns S4 defined between the first finger portions 342A is covered by one of the source finger patterns 352 of the source 350.

The drain 360 can have a plurality of drain finger patterns 362 and a drain connecting pattern 364 connected with the drain finger patterns 362. Each of the drain finger patterns 362 is in contact with the semiconductor layer 230 via one of the second auxiliary connecting portions 344C and two second finger portions 344A connected by the one of the second auxiliary connecting portions 344C in FIG. 7A. In other words, each of the strip patterns S5 defined between the second finger portions 344A is covered by one of the drain finger patterns 362 of the drain 360.

In the present embodiment, the etching stop layer 340 is substantially disposed on most of the area of the substrate 10. Therefore, the source 350 and the drain 360 of the active device 300 disposed on the etching stop layer 340 are not in contact with the gate insulation layer 220. In addition, the source 350 and the drain 360 are in contact with the semiconductor layer 230 only at the first contact opening 342 and the second contact opening 344. As a result, when the active device 300 is operating, a parasitic current between the source 350 and the drain 360 can be effectively reduced and device characters of the active device 300 are improved. In addition, in the present embodiment, a pair of electrodes (not shown) can be further disposed at the region outside the device disposition region 300A. The pair of electrodes can sandwich the insulation layer (such as the gate insulation layer 220 and the etching stop layer 340) therebetween to form a storage capacitor. In an embodiment, one (upper electrode) of the pair of electrodes can be connected to the source 350 while the other (bottom electrode) of the pair of electrodes can be connected to the gate 210 in the active device.

Figure 9A:
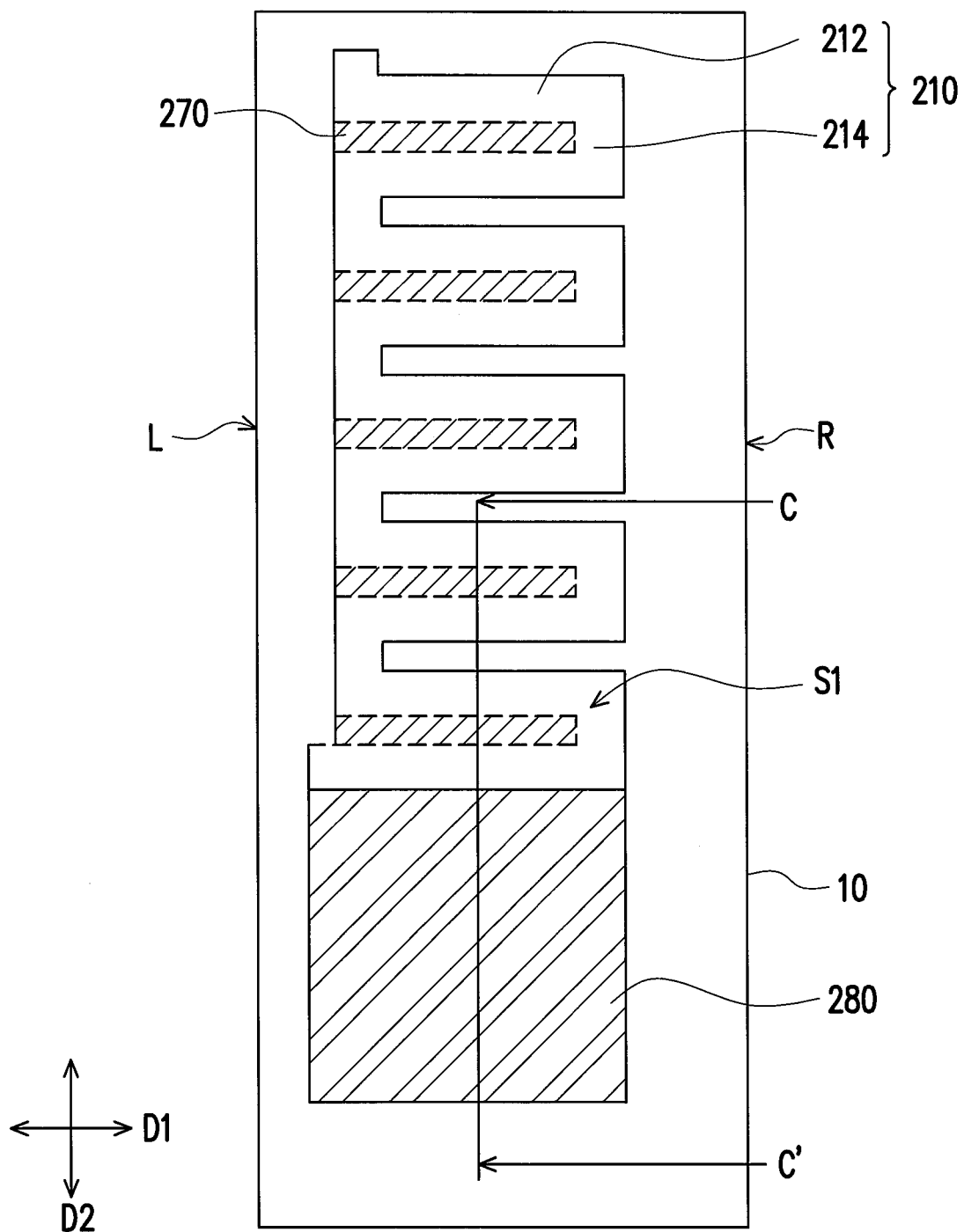
Figure 9B:
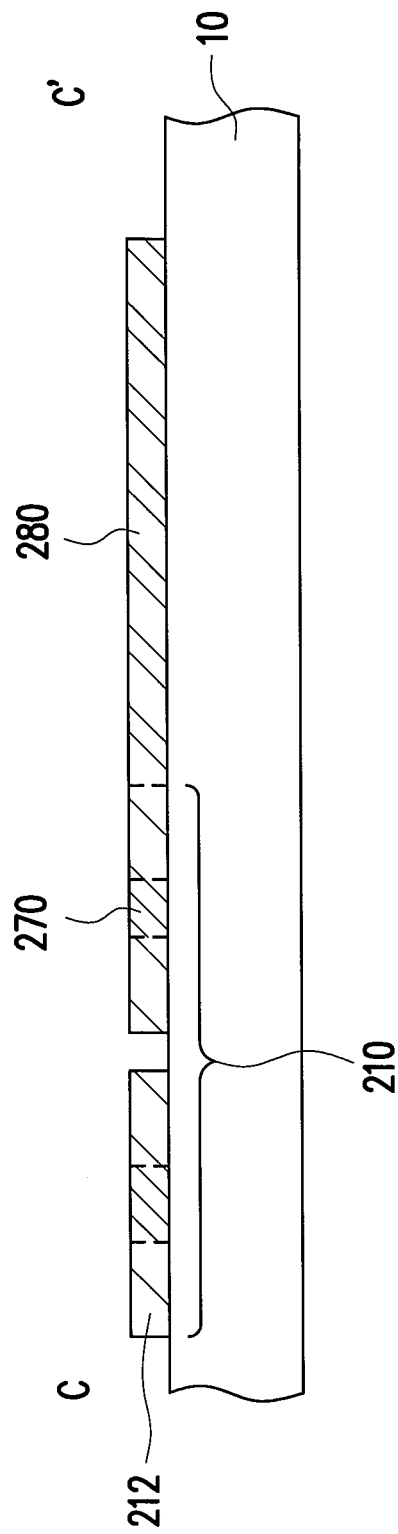

FIG. 9A to FIG. 12A are schematic top views illustrating each step of a fabricating process of an active device including a capacitor structure according to an embodiment of the invention. FIG. 9B to FIG. 12B are schematic cross-sectional views taken along lines C-C' depicted in top views of FIG. 9A to FIG. 12A. The active device of the present embodiment can be preferably applied in the driving circuit. In another embodiment, the active device according to the embodiment can be applied in the pixel 120 as depicted in above. Referring to FIG. 9A and FIG. 9B, a gate 210, a plurality of capacitor electrode patterns 270 and a capacitor bottom electrode 280 are formed on the substrate 10. The substrate 10 can be the substrate utilized to constructing any electronic device, for example, the substrate 10 can be the substrate 110 illustrated in FIG. 1 when the electronic device is the display panel 100 of FIG. 1.

In the present embodiment, the gate 210, similar to the aforesaid embodiments, includes a plurality of first directional portions 212 and a plurality of second directional portions 214 which are alternately connected to form a meandering pattern S1 on the substrate 10 as the top view shown in FIG. 9A. Herein, the first directional portions 212 are substantially parallel to each other, the second directional portions 214 are substantially parallel to each other, and an extending direction D1 of the first directional portions 212 intersects an extending direction D2 of the second directional portions 214. In other words, the second directional portions 214 are connected with all of the first directional portions 212.

The capacitor electrode patterns 270 are disposed between two adjacent first directional portions 212 and connected with the gate 210. In the present embodiment, the capacitor electrode patterns 270 and the gate 210 can be fabricated by the same film layer. In addition, the capacitor bottom electrode 280 can be formed by the same layer of the capacitor electrode patterns 280 and the gate 210.

As shown in FIG. 9A, the meandering pattern S1 can have a plurality of gaps with the openings facing toward the first side R and a plurality of gaps with openings facing toward the second side L while each of the capacitor electrode patterns 270 is located inside one of the gaps with openings facing toward the second side L and is in contact with the gate 210.

Figure 10A:
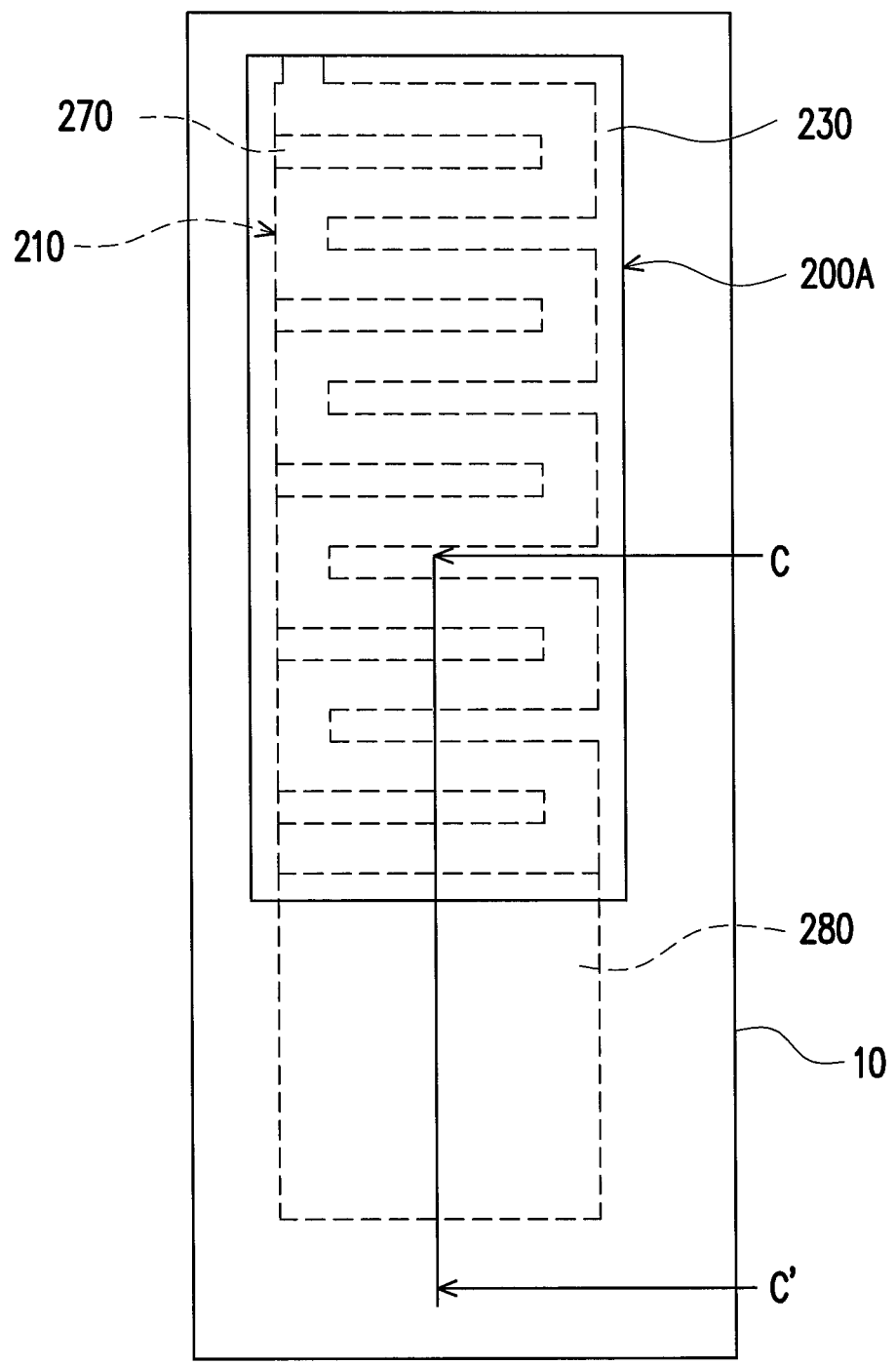
Figure 10B:
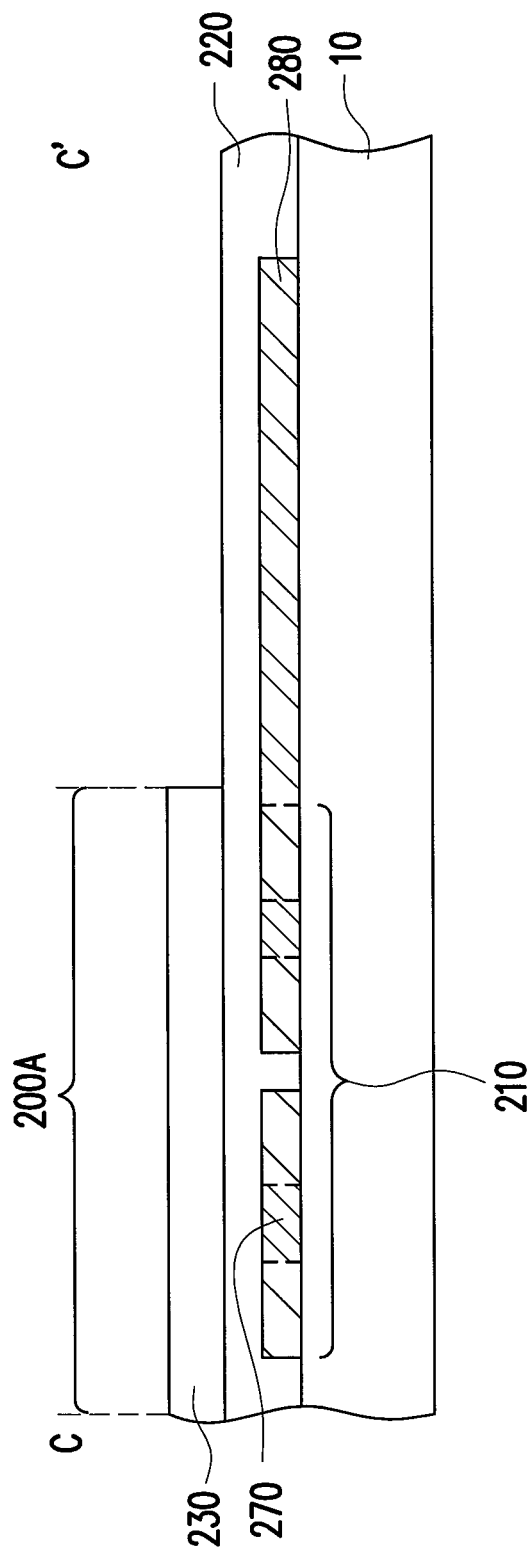

Next, referring to FIG. 10A and FIG. 10B, a gate insulation layer 220 and a semiconductor layer 230 located on the gate insulation layer 220 are formed on the substrate 10. The gate insulation layer 220 covers the entire of the gate 210, each of the capacitor electrode patterns 270 and the capacitor bottom electrode 280. In the embodiment, after the formation of the gate insulation layer 220, the semiconductor layer 230 is subsequently formed on the gate insulation layer 220. In the top view shown in FIG. 10A, the area of the semiconductor layer 230 and the area of the gate 210 are overlapped with each other. Herein, the semiconductor layer 230 can have a predetermined pattern which is compatible to the arrangement area of the gate 210. In an embodiment, the semiconductor layer 230 can have a rectangular pattern to define a device disposition region 200A and the gate 210 is substantially located inside the device disposition region 200A. Herein, the capacitor electrode patterns 270 can also be located inside the device disposition region 200A. The capacitor bottom electrode 280 as illustrated in FIG. 10A and FIG. 10B is then disposed beside the device disposition region 200A and in contact with the gate 210.

Figure 11A:
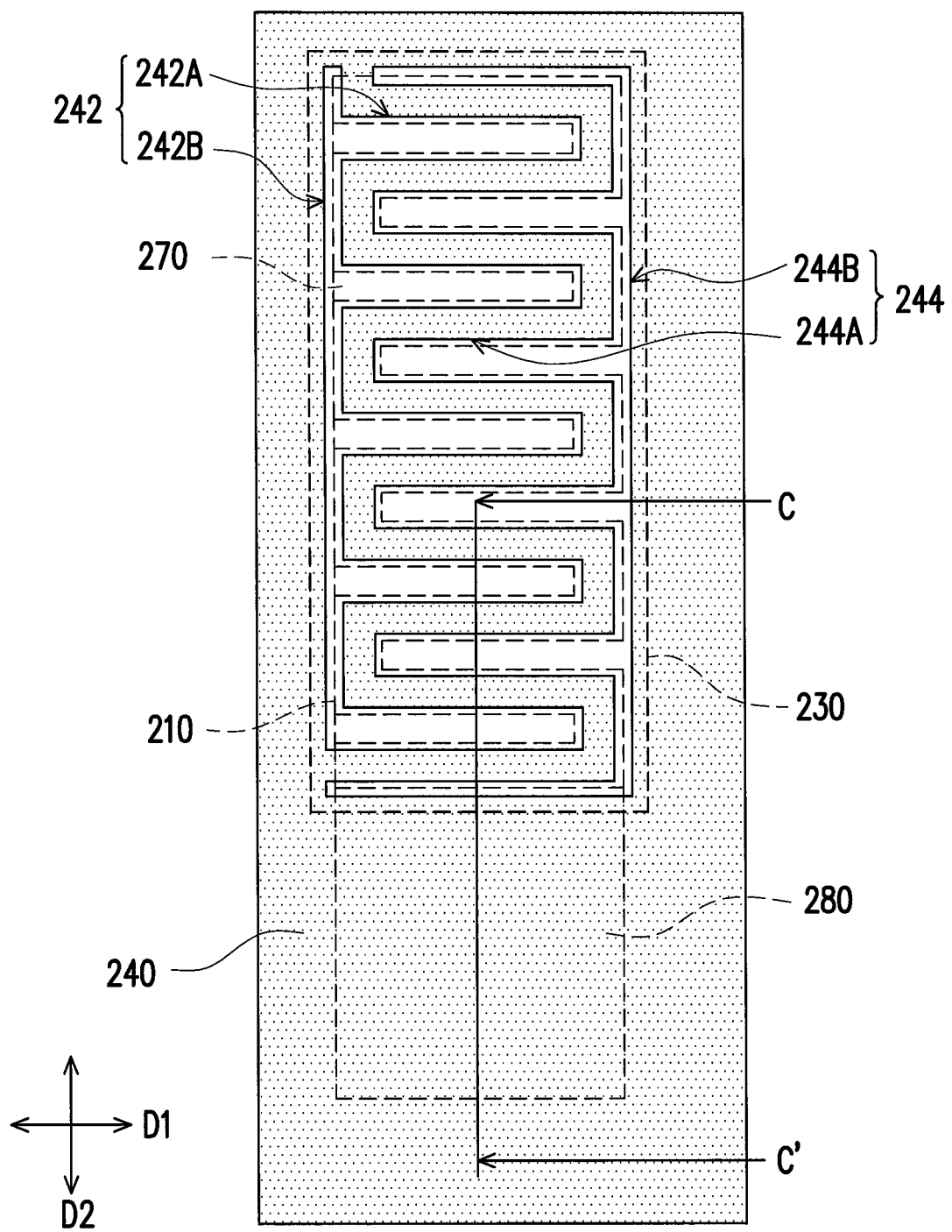
Figure 11B:
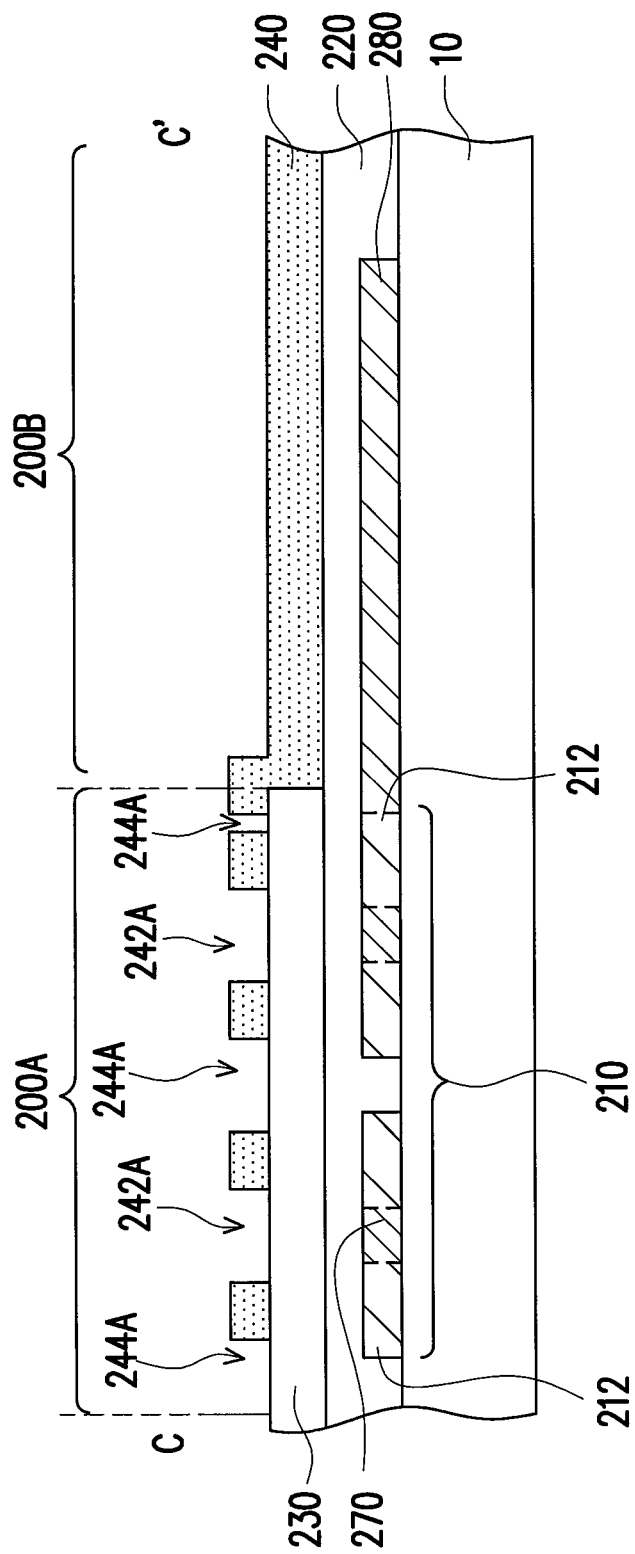

Thereafter, referring to FIG. 11A and FIG. 11B, an etching stop layer 240 is formed on the substrate 10. The etching stop layer 240 is disposed on the semiconductor layer 230 and is extending outward from the device disposition region 200A so as to substantially cover most of the area of the substrate 10. Accordingly, the etching stop layer 240 covers not only the elements located inside the device disposition region 200A but also the capacitor bottom electrode 280 located beside the device disposition region 200A. In the present embodiment, the etching stop layer 230 can have a first contact opening 242 and a second contact opening 244 both exposing the semiconductor layer 230 and not connected with each other. FIG. 11A shows the relationship of the disposition location of the gate 210 and the disposition locations of the first contact opening 242 and the second contact opening 244.

The first contact opening 242 has a plurality of first finger portions 242A and a first connecting portion 242B. The first finger portions 242A are substantially parallel to the extending direction D1 of the first directional portions 212 of the gate 210. The first connecting portion 242B is connected with all of the first finger portions 242A and is substantially parallel to the extending direction D2 of the second directional portions 214 of the gate 210. Furthermore, the first contact opening 242 can expose the area of the capacitor electrode patterns 270, for example.

The second contact opening 244 has a plurality of second finger portions 244A and a second connecting portion 244B. The second finger portions 244A are substantially parallel to the extending direction D1 of the first directional portions 212 of the gate 210. The second connecting portion 244B is connected with all of the second finger portions 244A and is substantially parallel to the extending direction D2 of the second directional portions 214 of the gate 210.

Figure 12A:
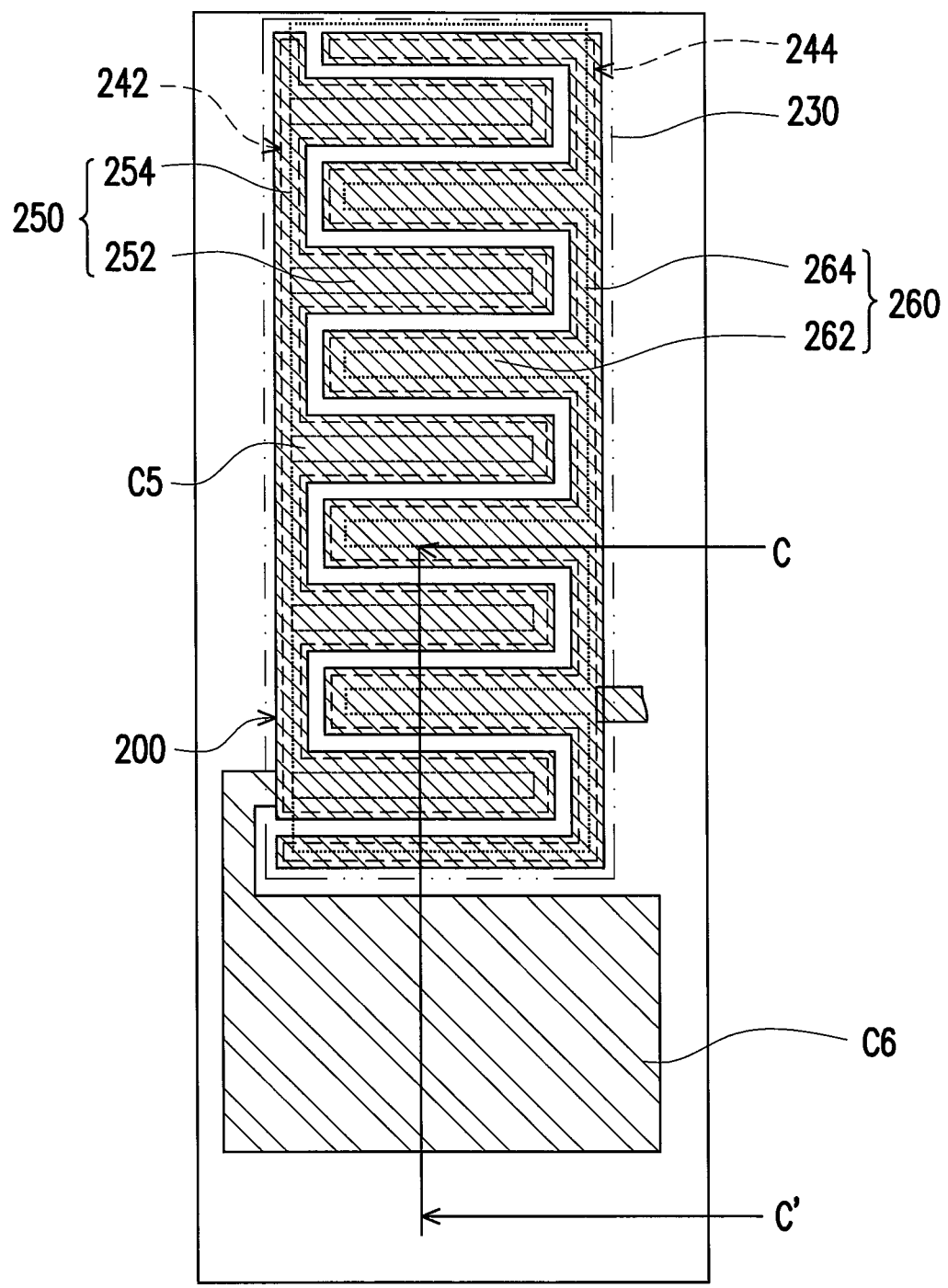
Figure 12B:
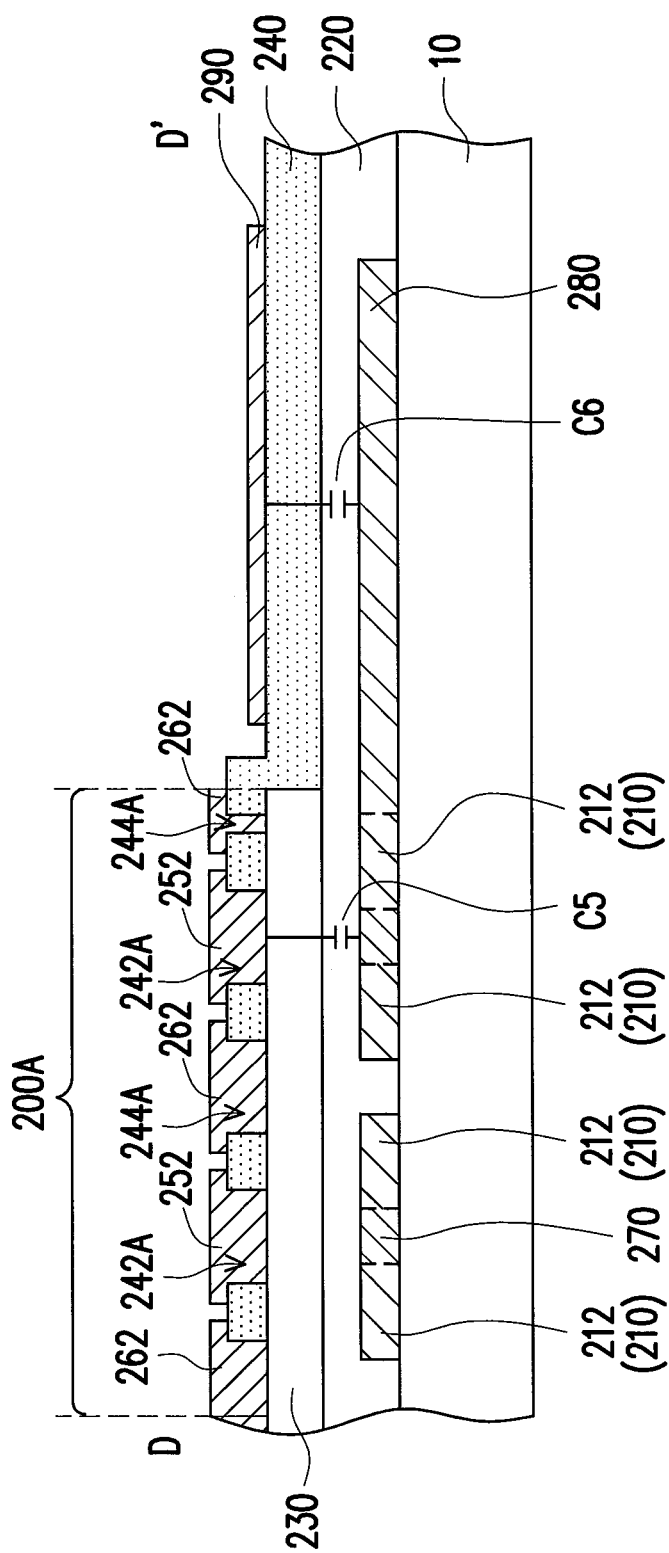

Subsequently, referring to FIG. 12A and FIG. 12B, a source 250 and a drain 260 are formed on the etching stop layer 240 so as to construct an active device 200 in the device disposition region 200A. In addition, a capacitor upper electrode 290 can be selectively formed on the etching stop layer 240, wherein the capacitor upper electrode 290 can be in contact with the source 250 as shown in the top view of FIG. 12A. In the present embodiment, the capacitor upper electrode 290 is located beside the device disposition region 200A and overlapped with the area of the capacitor bottom electrode 280.

The source 250 can have a plurality of source finger patterns 252 and a source connecting pattern 254 connected with the source finger patterns 252. Each of the source finger patterns 252 is in contact with the semiconductor layer 230 via one of the first finger portions 242A of the first contact opening 242. The source connecting pattern 254 is in contact with the semiconductor layer 230 via the first connecting portion 242B of the first contact opening 242. The drain 260 can have a plurality of drain finger patterns 262 and a drain connecting pattern 264 connected with all of the drain finger patterns 262. Each of the drain finger patterns 262 is in contact with the semiconductor layer 230 via one of the second finger portion 244A of the second contact opening 244. The drain connecting pattern 264 is in contact with the semiconductor layer 230 via the second connecting portion 244B of the second contact opening 244.

In the present embodiment, each of the capacitor electrode patterns 270 is overlapped with one of the source finger patterns 252 so that a first capacitor structure C5 is formed. In addition, the capacitor bottom electrode 280 and the capacitor bottom electrode 290 are overlapped with each other so as to form a second capacitor structure C6. Preferably, the capacitor upper electrode 290 can be connected to the source 250 of the active device 200 and the capacitor bottom electrode 280 can be connected to the gate 210 of the active device 200. Furthermore, the area that the capacitor electrode patterns 270 overlap with the source finger patterns 252 illustrated in FIG. 12A and FIG. 12B is substantially smaller than the area that the capacitor bottom electrode 280 overlaps with the capacitor upper electrode 290. Notably, the value of the capacitance of the capacitor structure is proportional to the overlapping area of the two electrodes of the capacitor structure. Therefore, in the present embodiment, the capacitance of the first capacitor structure C5 can be smaller, preferably, than the capacitance of the second capacitor structure C6. In another embodiment, the capacitance of the first capacitor structure C5 can be selectively greater than or identical to the capacitance of the second capacitor structure C6. In still another embodiment, the second capacitor structure C6 can be omitted if the first capacitor structure C5 has sufficient capacitance to achieve the required characteristic.

In the present embodiment, the capacitor electrode patterns 270 are fabricated inside the existed area of the device disposition region 200A, such that the capacitor electrode patterns 270 and the source finger patterns 252 construct the first capacitor structure C5. As such, the configuration of the first capacitor structure C5 does not require additional disposition area besides the device disposition region 200A, which is conducive to enhance the space utility efficiency.

For example, it is assumed that the electronic device requires the active device 200 being connected with a capacitor structure with a specific capacitance. In general, the capacitor structure with the required capacitance can be constructed by only the second capacitor structure C6 located at the region outside the existed device region 200A or by both the first capacitor structure C5 and the second capacitor structure C6. In comparison, the second capacitor structure C6 can have a first projection area on the substrate 10 when the capacitor structure is constructed by only the second capacitor structure C6, and the second capacitor structure C6 can have a second projection area on the substrate 10 when the capacitor structure is constructed by both the first capacitor structure C5 and the second capacitor structure C6. The first projection area of the second capacitor structure C6 must be greater than the second projection area of the first capacitor structure C5 for achieving the same capacitance. In an instance, when the first capacitor structure C5 and the second capacitor structure C6 are configured in the substrate, the second projection area of the first capacitor structure C5 can be reduce at least 12% of the first projection area of the second capacitor structure C6. Accordingly, with the disposition of the first capacitor structure C5 in the device region 200A, the elements such as the capacitor structure fabricated at the region outside the device region 200A can have reduced area to provide desirable space utility efficiency. In other words, a part of the element originally disposed at the region outside the device region 200A is fabricated inside the device region 200A so that the layout area can be saved for achieving the needed characteristic such as sufficient capacitance.

FIG. 13A to FIG. 15A are schematic top views illustrating each step of a fabricating process of an active device including a capacitor structure according to an embodiment of the invention. FIG. 13B to FIG. 15B are schematic cross-sectional views taken along lines D-D' depicted in top views of FIG. 13A to FIG. 15A. The active device of the present embodiment can be preferably applied in the driving circuit. In another embodiment, the active device according to the embodiment can be applied in the pixel 120 as depicted in above. In addition, the fabricating methods and the layout designs of the gate 210, the gate insulation layer 220, the capacitor electrode patterns 270 and the electrode bottom electrode 280 can be referred to those depicted in FIG. 9A, 10A, 9B and 10B, which are not reiterated here.

Figure 13A:
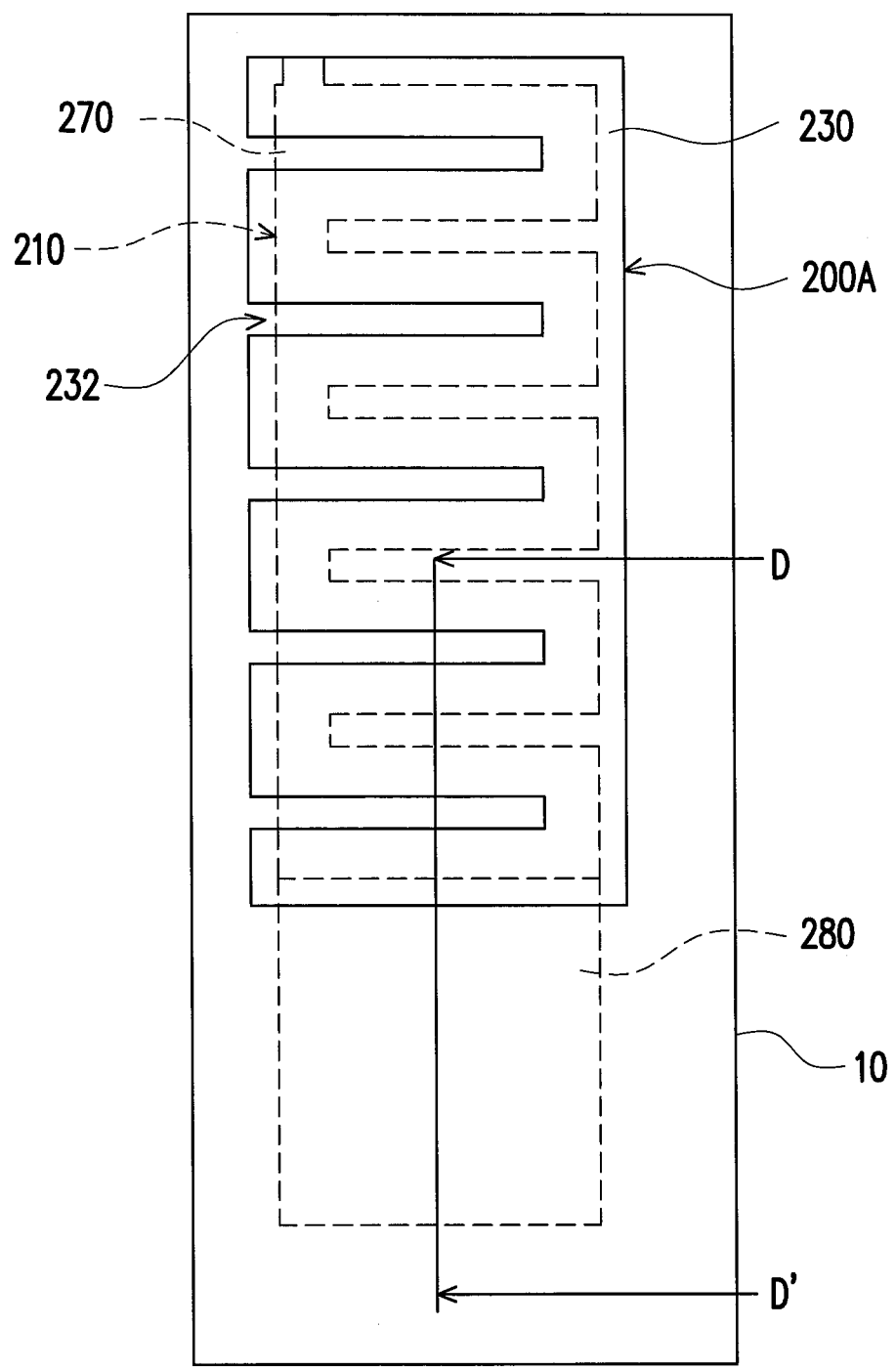
Figure 13B:
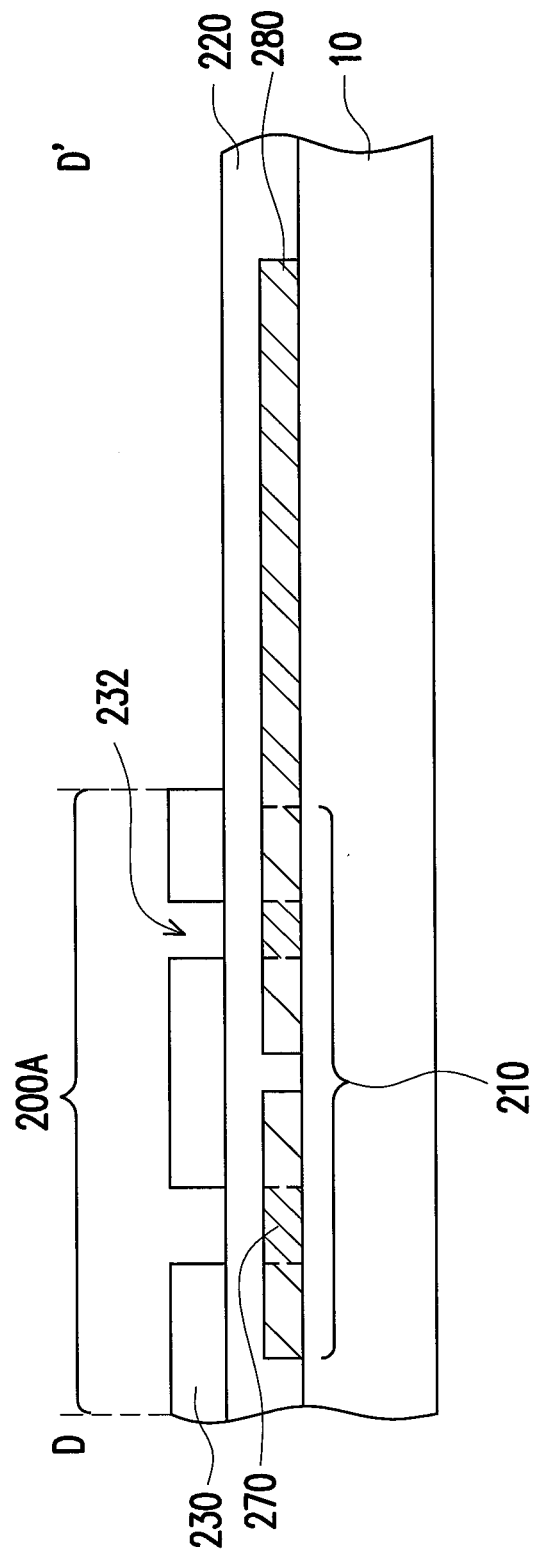

Referring to FIG. 13A and FIG. 13B, in the present embodiment, the semiconductor layer 230 can be fabricated as having a plurality of finger openings 232, wherein the finger openings 232 correspond to the area or the location where the capacitor electrode patterns 270 are, for example. Next, referring to FIG. 14A and FIG. 14B, an etching stop layer 240 is formed on the semiconductor layer 230, wherein the etching stop layer 240 has a first contact opening 242, a second contact opening 244 and a capacitor opening 246. In the embodiment, the shapes and the locations of the first contact opening 242 and the second contact opening 244 can be referred to the descriptions in above (e.g. FIG. 11A and FIG. 11B), which is not repeated herein.

Figure 14A:
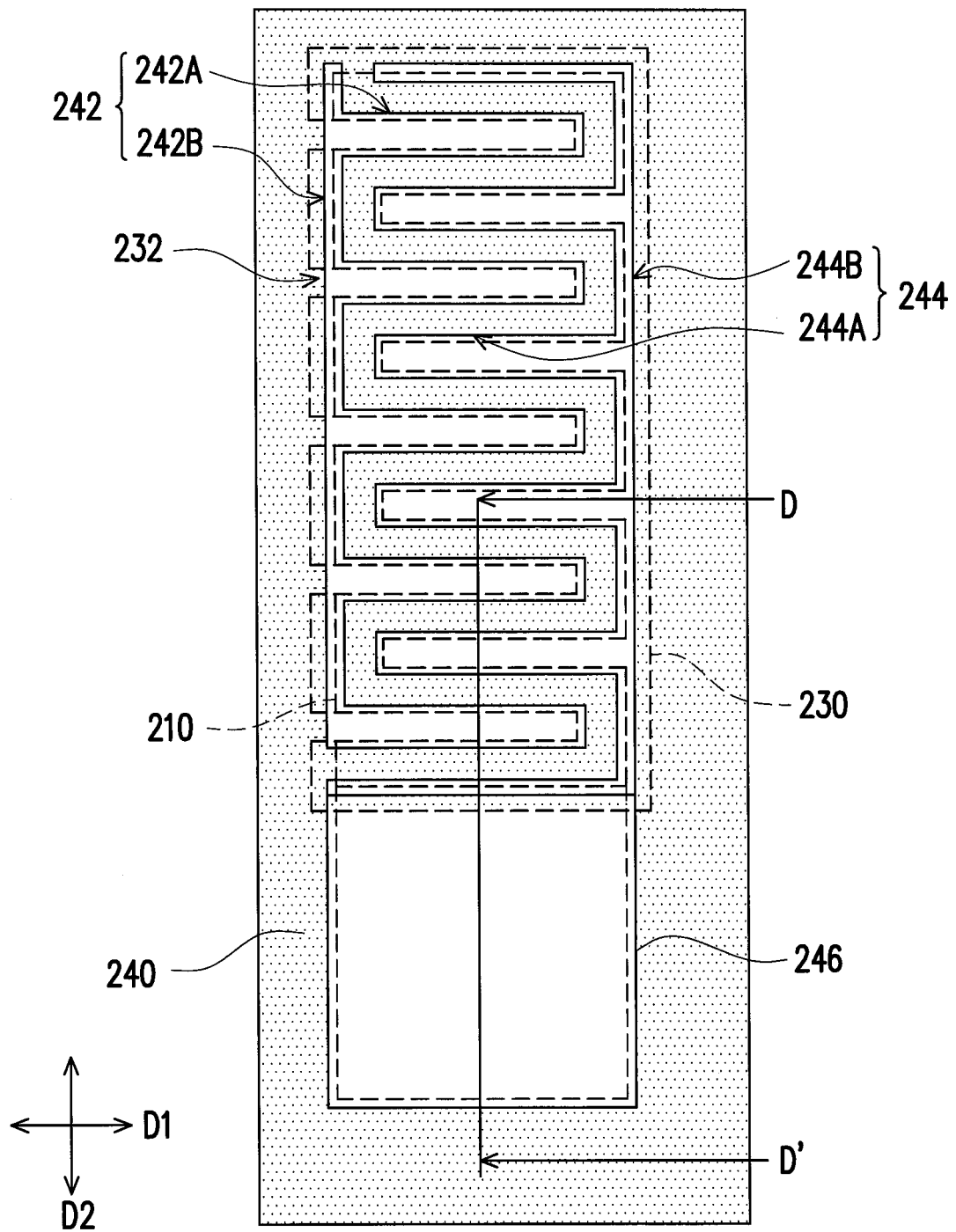
Figure 14B:
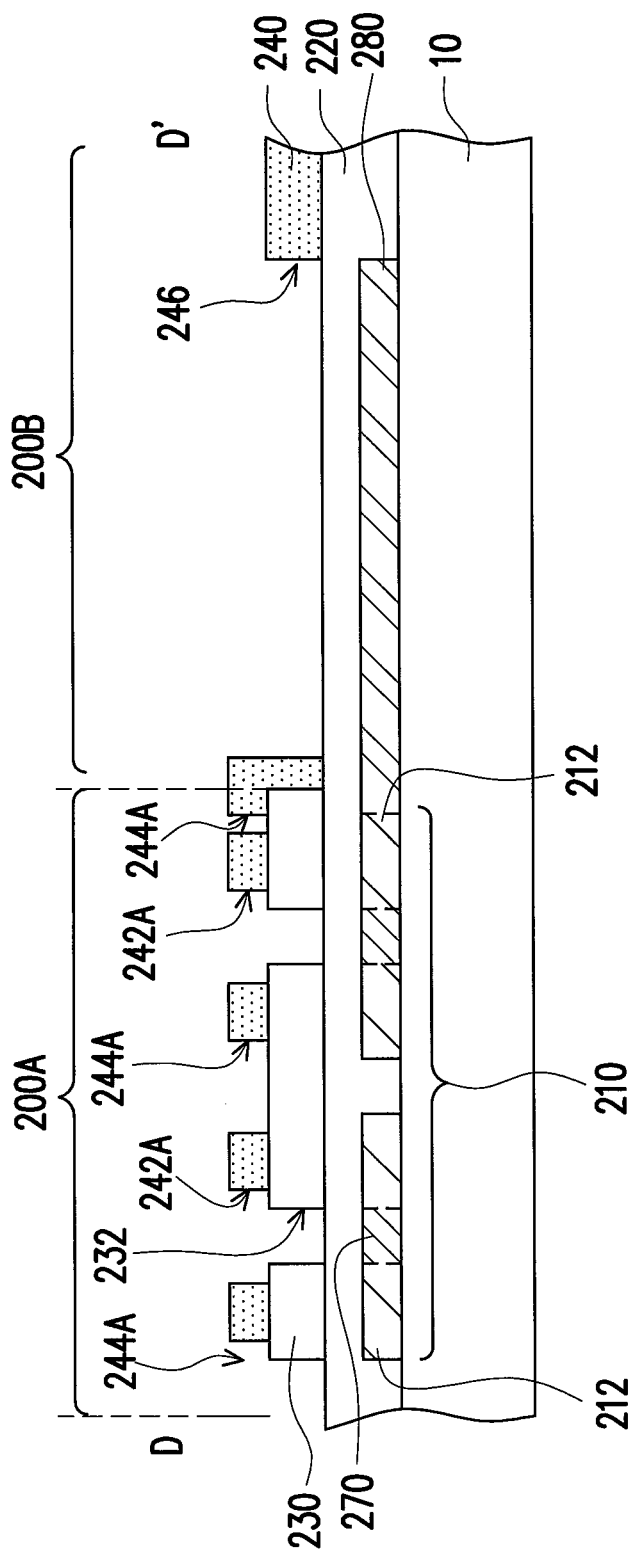

Each finger opening 232 of the semiconductor layer 230 can correspond to one of the first finger portions 242A of the first contact opening 242, and a width of the each finger opening 232 can be substantially smaller than a width of the one of the first finger portion 242A as shown in FIG. 14B. In the present embodiment, each first finger portion 242A is configured with a corresponding finger opening 232 so as to expose a portion of the gate insulation layer 220. In addition, the location of the capacitor opening 246 can be, for example, fabricated inside the area of the capacitor bottom electrode 280. In specific, the named capacitor opening in the embodiment means the opening formed in the etching stop layer 240 for exposing the area where the capacitor structure is. Accordingly, the first finger portions 242A of the first contact opening 242 capable of exposing the capacitor electrode patterns 270 can be served as one capacitor opening.

Figure 15A:
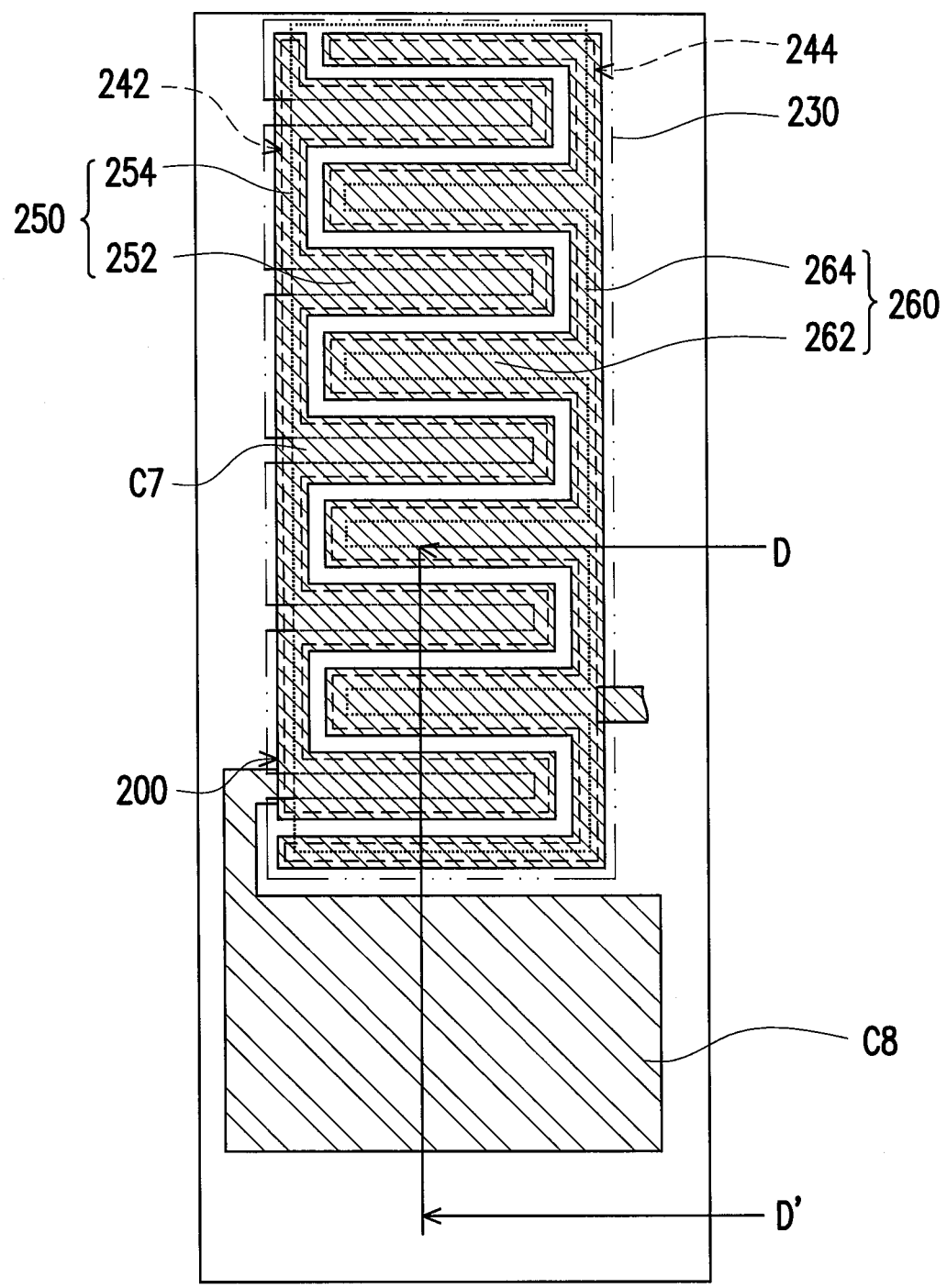
Figure 15B:
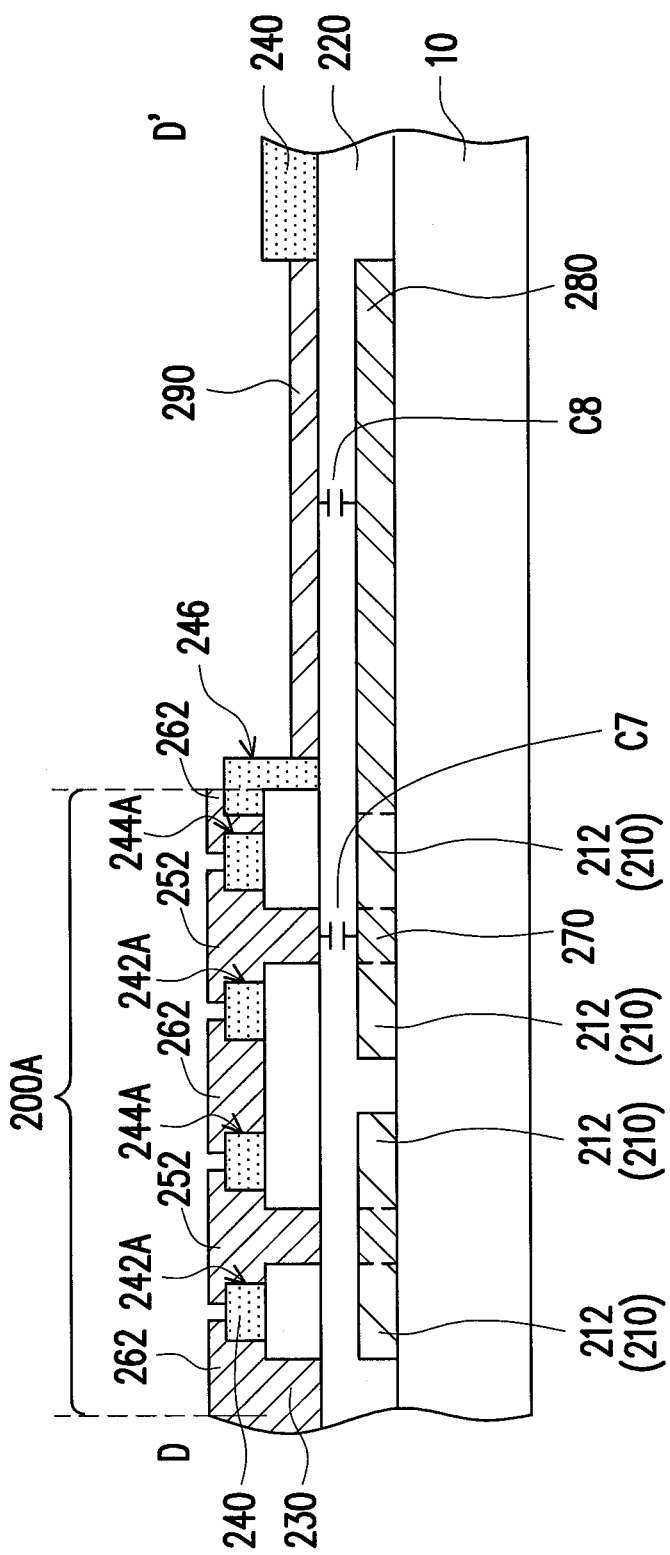

Referring to FIG. 15A and FIG. 15B, a source 250 and a drain 260 are formed on the etching stop layer 240 so as to construct an active device 200 in the device disposition region 200A. In addition, a capacitor upper electrode 290 can be fabricated corresponding to the capacitor opening 246 for in contact with the source 250 as shown in FIG. 15A.

The source 250 can have a plurality of source finger patterns 252 and a source connecting patterns 254 connected with all of the source finger patterns 252. Each of the source finger patterns 252 is in contact with the semiconductor layer 230 via one of the first finger portions 242A of the first contact opening 242. The source connecting pattern 254 is in contact with the semiconductor layer 230 via the first connecting portion 242B of the first contact opening 242. The drain 260 can have a plurality of drain finger patterns 262 and a drain connecting patterns 264 connected with all of the drain finger patterns 262. Each of the drain finger patterns 262 is in contact with the semiconductor layer 230 via one of the second finger portions 244A of the second contact opening 244. The drain connecting pattern 264 is in contact with the semiconductor layer 230 via the second connecting portion 244B of the second contact opening 244.

In the present embodiment, a portion of each source finger pattern 252 is located inside one finger opening 232 of the semiconductor layer 230 while another portion of the each source finger pattern 252 is in contact with the semiconductor layer 230. The portion of the source finger pattern 252 located inside the finger opening 232 can be overlapped with the corresponding capacitor electrode pattern 270 so that a first capacitor structure C7 is formed. In addition, the capacitor upper electrode 290 located inside the capacitor opening 246 is overlapped with the capacitor bottom electrode 280 so that a second capacitor structure C8 is formed. In a preferred embodiment, the capacitor upper electrode 290 is connected with the source 250 of the active device and the capacitor bottom electrode 280 is connected with the gate 210 of the active device. As shown in FIG. 15B, in the cross-sectional view, the capacitor opening 246 and the first finger portions 242A can respectively expose the area of the second capacitor structure C8 and the area of the first capacitor structure C7.

It is noted that the source 250 is disposed inside the finger opening 232 as shown in the cross-sectional view of FIG. 15B, such that a distance between the source finger patterns 252 and the capacitor electrode patterns 270 is reduced in compared to the design of the aforesaid embodiments to substantially equivalent to the thickness of the gate insulation layer 220. Similarly, the capacitor upper electrode 290 and the capacitor bottom electrode 280 can be closer in relative to the aforesaid embodiments.

In the first capacitor structure C7 according to the present embodiment, only the gate insulation layer 220 is formed between the source 250 and the capacitor electrode patterns 270. In the second capacitor structure C8, similarly, only the gate insulation layer 220 is formed between the capacitor upper electrode 290 and the capacitor bottom electrode 280. Owing that the distance between the conductive electrodes of the capacitor structure is reduced, the capacitance of the capacitor structure C7 and the capacitance of the capacitor structure C8 can be enhanced. In the present embodiment, as shown in FIG. 15A and FIG. 15B, the overlapping area of the capacitor electrode patterns 270 and the source finger patterns 242 is substantially smaller than the overlapping area of the capacitor bottom electrode 280 and the capacitor upper electrode 290. With the configuration of the first capacitor structure C7, the projection area of the second capacitor structure C8 on the substrate 10 can be reduced to at least 12% for the total capacitor structure achieving sufficient capacitance. Notably, the value of the capacitance of the capacitor structure is proportional to the overlapping area of the two electrodes of the capacitor structure. Therefore, in the present embodiment, the capacitance of the first capacitor structure C7 can be smaller, preferably, than the capacitance of the second capacitor structure C8. In another embodiment, the capacitance of the first capacitor structure C7 can be selectively greater than or identical to the capacitance of the second capacitor structure C8. In still another embodiment, the second capacitor structure C8 can be omitted if the first capacitor structure C7 has sufficient capacitance to achieve the required characteristic.

Furthermore, in the present embodiment, the capacitor electrode patterns 270 is formed in the gaps of the pattern of the gate 210, so that the capacitor electrode pattern 270 and the source finger patterns 252 are overlapped with each other to form the first capacitor structure C7 inside the exist device disposition region 200A. The combination of the first capacitor structure C7 and the second capacitor structure C8 located beside the device disposition region 200A conduces to provide sufficient total capacitance and improve the space utility efficiency.

In summary, in the invention, the etching stop layer substantially covering most of the area of the substrate is disposed on the semiconductor layer, and the source and the drain are in contact with the semiconductor layer only via contact openings in the etching stop layer. The parasitic current is not easily generated between the source and the drain which helps to enhance device characters of the active device. In an embodiment of the invention, the capacitor electrode patterns can be formed in the existed device disposition region such that the overlapping of the capacitor electrode patterns and the source forms a first capacitor structure. The first capacitor structure can be combined with a second capacitor structure fabricated at the region outside the device disposition region for providing sufficient or required capacitance, which is conducive to efficiently utilize the layout space (or area). In addition, applying the active device according to the embodiments of the invention to electronic devices to be an element of driving circuit structures or be a switch of pixels in display panels helps to enhance the quality of electronic devices and display panels.

Although the invention is disclosed with the aforementioned embodiments, the invention is not limited herein. It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An active device disposed in a pre-determined device region of a substrate, wherein the active device comprising:
   a gate comprising a plurality of first directional portions and a plurality of second directional portions, and the first directional portions and the second directional portions connected alternately to form a meandering pattern on the substrate, wherein the first directional portions are substantially parallel to one another, the second directional portions are substantially parallel to one another, and an extending direction of the first directional portions intersects an extending direction of the second directional portions;
   a gate insulation layer covering the gate;
   a semiconductor layer disposed on the gate insulation layer, the semiconductor layer disposed above the gate, and an area of the semiconductor layer substantially defining the pre-determined device region;
   an etching stop layer disposed on the gate insulation layer and the semiconductor layer, the etching stop layer having a first contact opening and a second contact opening both exposing the semiconductor layer and not connected with each other, the first contact opening having a plurality of first finger portions substantially parallel to the first directional portions and at least one first connecting portion connected with the first finger portions and substantially parallel to the second directional portions, and the second contact opening having a plurality of the second finger portions substantially parallel to the first directional portions and at least one second connecting portion connected with the second finger portions and substantially parallel to the second directional portions, wherein each of the first finger portions and one of the second finger portions are disposed on two sides of one of the first directional portions, respectively;
   a source disposed on the etching stop layer and in contact with the semiconductor layer via the first contact opening; and
   a drain disposed on the etching stop layer and in contact with the semiconductor layer via the second contact opening, and the source and the drain being separated from each other.

2. The active device of claim 1, wherein the gate insulation layer and the etching stop layer are further extended to a region outside the pre-determined device region, and the etching stop layer is in contact with the gate insulation layer at the region outside the pre-determined device region.

3. The active device of claim 1, wherein parts of the second directional portions are connected with first ends of the directional portions, the rest of the second directional portions are connected with second ends of the first directional portions, and each of the second directional portions is connected with two first directional portions so as to form the meandering pattern.

4. The active device of claim 1, wherein the at least one first connecting portion of the first contact opening and the at least one second connecting portion of the second contact opening are disposed on opposite ends of the first directional portions of the gate, respectively.

5. The active device of claim 1, wherein the number of the at least one first connecting portion is plural, the first contact opening further comprises a plurality of first auxiliary connecting portions, each of the first auxiliary connecting portions is connected with two of the first finger portions, and the first auxiliary connecting portions and the first connecting portions are disposed on first and second ends of the first finger portions, respectively.

6. The active device of claim 5, wherein the source has a plurality of source finger patterns, and each of the source finger patterns is in contact with the semiconductor layer via one of the first auxiliary connecting portions and two of the first finger portions connected by the one of the first auxiliary connecting portions.

7. The active device of claim 5, wherein the number of the at least one second connecting portion is plural, the second contact opening further comprises a plurality of second auxiliary connecting portions, each of the second auxiliary connecting portions is connected with two of the second finger portions, and the second auxiliary connecting portions and the second connecting portions are disposed on first and second ends of the second finger portions, respectively.

8. The active device of claim 7, wherein the drain has a plurality of drain finger patterns, and each of the drain finger patterns is in contact with the semiconductor layer via one of the second auxiliary connecting portions and two of the second finger portions connected by the one of the second auxiliary connecting portions.

9. The active device of claim 7, further comprising a plurality of capacitor electrode patterns connected with the gate, wherein each of the capacitor electrodes patterns is disposed between two adjacent first directional portions, and a capacitor structure is defined by overlapping the capacitor electrode patterns and the source with each other.

10. The active device of claim 9, wherein the semiconductor layer has a plurality of finger openings, each of the finger openings corresponds to one first finger portion of the first contact opening and is substantially smaller than the one first finger portion, and a portion of the source is located inside the finger openings while another portion of the source is in contact with the semiconductor layer.

11. The active device of claim 9, wherein the etching stop layer has at least one capacitor opening exposing an area of the capacitor structure.

12. A driving circuit structure disposed on a substrate, and the substrate having at least one pre-determined device region and at least one element region and the driving circuit structure utilized to drive at least one element in the element region, wherein the driving circuit structure comprises at least one active device disposed in the device pre-determined region and the active device comprises:
   a gate comprising a plurality of first directional portions and a plurality of second directional portions, and the first directional portions and the second directional portions connected alternately and forming a meandering pattern on the substrate, wherein the first directional portions are substantially parallel to one another, the second directional portions are substantially parallel to one another, and an extending direction of the first directional portions intersects an extending direction of the second directional portions;
   a gate insulation layer covering the gate;
   a semiconductor layer disposed on the gate insulation layer, the semiconductor layer disposed above the gate, and an area of the semiconductor layer substantially defining the pre-determined device region;
   an etching stop layer disposed on the gate insulation layer and the semiconductor layer, the etching stop layer having a first contact opening and a second contact opening both exposing the semiconductor layer and not connected with each other, the first contact opening having a plurality of first finger portions substantially parallel to the first directional portions and at least one first connecting portion connected with the first finger portions and substantially parallel to the second directional portions, the second contact opening having a plurality of the second finger portions substantially parallel to the first directional portions and at least one second connecting portion connected with the second finger portions and substantially parallel to the second directional portions, wherein each of the first finger portions and one of the second finger portions are disposed on two sides of one of the first directional portions, respectively;
   a source disposed on the etching stop layer and in contact with the semiconductor layer via the first contact opening; and
   a drain disposed on the etching stop layer and in contact with the semiconductor layer via the second contact opening, and the source and the drain being separated from each other.

13. The driving circuit structure of claim 12, wherein the gate insulation layer and the etching stop layer are further extended to a region outside the pre-determined device region and the etching stop layer is in contact with the gate insulation layer at the region outside the pre-determined device region.

14. The driving circuit structure of claim 12, wherein parts of the second directional portions are connected with first ends of the first directional portions and the rest of the second directional portions are connected with second ends of the first directional portions, and each of the second directional portions is connected with two first directional portions so as to form the meandering pattern.

15. The driving circuit structure of claim 12, wherein the at least one first connecting portion of the first contact opening and the at least one second connecting portion of the second contact opening are disposed on two opposite ends of the first directional portions of the gate, respectively.

16. The driving circuit structure of claim 12, wherein the number of the at least one first connecting portions is plural, the first contact opening further comprises a plurality of first auxiliary connecting portions, each of the first auxiliary connecting portions is connected with two of the first finger portions, and the first auxiliary connecting portions and the first connecting portions are disposed on first and second ends of the first finger portions, respectively.

17. The driving circuit structure of claim 16, wherein the source has a plurality of source finger patterns, and each of the source finger patterns is in contact with the semiconductor layer via one of the first auxiliary connecting portions and two of the first finger portions connected by the one of the first auxiliary connecting portions.

18. The driving circuit structure of claim 16, wherein the number of the at least one second connecting portions is plural, the second contact opening further comprises a plurality of second auxiliary connecting portions, each of the second auxiliary connecting portions is connected with two of the second finger portions, and the second auxiliary connecting portions and the second connecting portions are disposed on first and second ends of the second finger portions, respectively.

19. The driving circuit structure of claim 18, wherein the drain has a plurality of drain finger patterns and each of the drain finger patterns is in contact with the semiconductor layer via one of the second auxiliary connecting portions and two of the second finger portions connected by the one of the second auxiliary connecting portions.

20. The driving circuit structure of claim 12 further comprising a plurality of capacitor electrode patterns connected with the gate, wherein each of the capacitor electrodes patterns is disposed between two adjacent first directional portions and a first capacitor structure is defined by overlapping the capacitor electrode patterns and the source with each other.

21. The driving circuit structure of claim 20, wherein the semiconductor layer has a plurality of finger openings, each of the finger openings corresponds to one first finger portion of the first contact opening and is substantially smaller than the one first finger portion, and a portion of the source is located inside the finger openings while another portion of the source is in contact with the semiconductor layer.

22. The driving circuit structure of claim 20 further comprising a capacitor bottom electrode and a capacitor upper electrode located beside the pre-determined device region and respectively connected to the gate and the source, wherein the capacitor bottom electrode overlaps with the capacitor upper electrode to define a second capacitor structure, and a capacitance of the first capacitor structure is substantially smaller than a capacitance of the second capacitor structure.

23. The driving circuit structure of claim 22, wherein the etching stop layer has at least one capacitor opening exposing an area of at least one of the first capacitor structure and the second capacitor structure.

24. A display panel comprising a substrate and a plurality of pixels disposed on the substrate and the substrate having at least one display region and at least one periphery region disposed at peripheries of the display region, and the pixels disposed in the display region, wherein each of the pixels comprises at least one active device and at least one pixel electrode electrically connected with the active device, and the active device comprises:
- a gate comprising a plurality of first directional portions and a plurality of second directional portions, and the first directional portions and the second directional portions connected alternately and forming a meandering pattern on the substrate, wherein the first directional portions are substantially parallel to one another, the second directional portions are substantially parallel to one another, and an extending direction of the first directional portions intersects an extending direction of the second directional portions;
- a gate insulation layer covering the gate;
- a semiconductor layer disposed on the gate insulation layer, the semiconductor layer disposed above the gate, and an area of the semiconductor layer substantially defining a pre-determined device region;
- an etching stop layer disposed on the gate insulation layer and the semiconductor layer, the etching stop layer having a first contact opening and a second contact opening exposing the semiconductor layer and not connected with each other, the first contact opening having a plurality of first finger portions substantially parallel to the first directional portions and at least one first connecting portion connected with the first finger portions and substantially parallel to the second directional portions, and the second contact opening having a plurality of the second finger portions substantially parallel to the first directional portions and at least one second connecting portion connected with the second finger portions and substantially parallel to the second directional portions, wherein each of the first finger portions and one of the second finger portions are disposed on two sides of one of the first directional portions, respectively;
- a source disposed on the etching stop layer and in contact with the semiconductor layer via the first contact opening; and
- a drain disposed on the etching stop layer and in contact with the semiconductor layer via the second contact opening, and the source and the drain being separated from each other.

25. The display panel of claim 24, wherein the gate insulation layer and the etching stop layer are further extended to a region outside the pre-determined device region and the etching stop layer is in contact with the gate insulation layer at the region outside the pre-determined device region.

26. The display panel of claim 24, wherein parts of the second directional portions are connected with first ends of the first directional portions, the rest of the second directional portions are connected with second ends of the first directional portions, and each of the second directional portions is connected with two first directional portions to form the meandering pattern.

27. The display panel of claim 24, wherein the at least one first connecting portion of the first contact opening and the at least one second connecting portion of the second contact opening are disposed on two opposite ends of the first directional portions of the gate, respectively.

28. The display panel of claim 24, wherein the number of the at least one first connecting portion is plural, the first contact opening further comprises a plurality of first auxiliary connecting portions and each of the first auxiliary connecting portions is connected with two of the first finger portions, and the first auxiliary connecting portions and the first connecting portions are disposed on first and second ends of the first finger portions, respectively.

29. The display panel of claim 28, wherein the source has a plurality of source finger patterns, and each of the source finger patterns is in contact with the semiconductor layer via one of the first auxiliary connecting portions and two of the first finger portions connected by the one of the first auxiliary connecting portions.

30. The display panel of claim 28, wherein the number of the at least one second connecting portion is plural, the second contact opening further comprises a plurality of second auxiliary connecting portions and each of the second auxiliary connecting portions is connected with two of the second finger portions, and the second connecting portions and the second auxiliary connecting portions are disposed on first and second ends of the second finger portions, respectively.

31. The display panel of claim 30, wherein the drain has a plurality of drain finger patterns, and each of the drain finger patterns is in contact with the semiconductor layer via one of the second auxiliary connecting portions and two of the second finger portions connected by the one of the second auxiliary connecting portions.

32. The display panel of claim 24, wherein each of the pixel further comprises a plurality of capacitor electrode patterns connected with the gate, each of the capacitor electrode patterns is disposed between two adjacent first directional portions, and a first capacitor structure is defined by overlapping the capacitor electrode patterns and the source with each other.

33. The display panel of claim 32, wherein the semiconductor layer has a plurality of finger openings, each of the finger openings corresponds to one of the first finger portions of the first contact opening and substantially smaller than the one of the first finger portions, and a portion of the source is located inside the finger openings while another portion of the source is in contact with the semiconductor layer.

34. The display panel of claim 32, wherein each of the pixel further comprises a capacitor bottom electrode and a capacitor upper electrode located beside the device disposition region and respectively connected with the gate and the source, a second capacitor structure is defined by overlapping the capacitor bottom electrode with the capacitor upper electrode, and a capacitance of the first capacitor structure is substantially smaller than a capacitance of the second capacitor structure.

35. The display panel of claim 34, wherein the etching stop layer has at least one capacitor opening exposing an area of at least one of the first capacitor structure and the second capacitor structure.

36. The display panel as recite in claim 24 further comprising a driving circuit structure disposed in the periphery region to drive the active devices of the pixels and the driving circuit structure comprising a peripheral active device and the peripheral active device comprising:
- a peripheral gate comprising a plurality of first peripheral directional portions and a plurality of second peripheral directional portions, the first peripheral directional portions and the second peripheral directional portions connected alternately to form a peripheral meandering pattern on the substrate, and the gate insulation layer further covering the peripheral gate, wherein the first peripheral directional portions are substantially parallel to one another, the second peripheral directional portions are parallel to one another, and an extending direction of the first peripheral directional portions intersects an extending direction of the second peripheral directional portions;

a peripheral semiconductor layer disposed on the gate insulation layer, the peripheral semiconductor layer disposed above the peripheral gate, an area of the peripheral semiconductor layer substantially defining a peripheral pre-determined device region, and the etching stop layer extended to the periphery region and further comprising a first peripheral contact opening and a second peripheral contact opening both exposing the peripheral semiconductor layer and not connected with each other, the first peripheral contact opening having a plurality of first peripheral finger portions substantially parallel to the first peripheral directional portions and at least one first peripheral connecting portion connected with the first peripheral finger portions and substantially parallel to the second peripheral directional portions, and the second peripheral contact opening having a plurality of second peripheral finger portions substantially parallel to the first peripheral directional portions and at least one second peripheral connecting portions connected with the second peripheral finger portions and substantially parallel to the second peripheral directional portions, wherein each of the first peripheral finger portions and one of the second peripheral finger portions are disposed on two sides of one of the first peripheral directional portions, respectively;

a peripheral source disposed on the etching stop layer and in contact with the peripheral semiconductor layer via the first peripheral contact opening; and a peripheral drain disposed on the etching stop layer and in contact with the peripheral semiconductor layer via the second peripheral contact opening and the peripheral source and the peripheral drain separated from each other.

37. The display panel of claim 36, wherein the etching stop layer is in contact with the gate insulation layer at a region outside the peripheral pre-determined device region and the pre-determined device region.

38. The display panel of claim 36, wherein parts of the second peripheral directional portions are connected with first ends of the first peripheral directional portions, the rest of the second peripheral directional portions are connected with second ends of the first peripheral directional portions, and each of the second peripheral directional portions is connected with two first peripheral directional portions to form the peripheral meandering pattern.

39. The display panel of claim 36, wherein the at least one first peripheral connecting portions of the first peripheral contact opening and the at least one second peripheral connecting portions of the second peripheral contact opening are disposed on first ends and second ends of the first peripheral directional portions of the peripheral gate, respectively.

40. The display panel of claim 36, wherein the number of the at least one first peripheral connecting portion is plural, the first peripheral contact opening further comprises a plurality of first peripheral auxiliary connecting portions, each of the first peripheral auxiliary connecting portions is connected with two of the first peripheral finger portions, and the first peripheral auxiliary connecting portions and the first peripheral connecting portions are disposed on first and second ends of the first peripheral finger portions, respectively.

41. The display panel of claim 40, wherein the peripheral source has a plurality of peripheral source finger patterns, and each of the peripheral source finger patterns is in contact with the peripheral semiconductor layer via one of the first peripheral auxiliary connecting portions and the first peripheral finger portions connected by the one of the first peripheral auxiliary connecting portions.

42. The display panel of claim 40, wherein the number of the at least one second peripheral connecting portion is plural, the second peripheral contact opening further comprises a plurality of second peripheral auxiliary connecting portions, each of the second peripheral auxiliary connecting portions is connected with two of the second peripheral finger portions, and the second peripheral auxiliary connecting portions and the second peripheral connecting portions are disposed on first and second ends of the second peripheral finger portions, respectively.

43. The display panel of claim 42, wherein the peripheral drain has a plurality of peripheral drain finger patterns, and each of the peripheral drain finger patterns is in contact with the peripheral semiconductor layer via one of the second peripheral auxiliary connecting portions and the second peripheral finger portions connected by the one of the second peripheral auxiliary connecting portions.

44. The display panel of claim 36, wherein the driving circuit structure further comprises a plurality of capacitor electrode patterns connected with the peripheral gate, wherein each of the capacitor electrode patterns is disposed between two adjacent first peripheral directional portions of the peripheral gate, and a first capacitor structure is defined by overlapping the capacitor electrode patterns and the peripheral source with each other.

45. The display panel of claim 44, wherein the peripheral semiconductor layer has a plurality of finger openings, each of the finger openings corresponds to one of the first peripheral finger portions of the first peripheral contact opening and substantially smaller than the one of the first peripheral finger portion, and a portion of the peripheral source is located inside the finger openings while another portion of the peripheral source is in contact with the peripheral semiconductor layer.

46. The display panel of claim 44, wherein the driving circuit structure further comprises a capacitor bottom electrode and a capacitor upper electrode located beside the peripheral device disposition region and respectively connected with the peripheral gate and the peripheral source, a second capacitor structure is defined by overlapping the capacitor bottom electrode with the capacitor upper electrode, and a capacitance of the first capacitor structure is substantially smaller than a capacitance of the second capacitor structure.

47. The display panel of claim 46, wherein the etching stop layer has at least a capacitor opening exposing an area of at least one of the first capacitor structure and the second capacitor structure.

\* \* \* \* \*